United States Patent
Kyono et al.

(10) Patent No.: US 7,851,821 B2
(45) Date of Patent: Dec. 14, 2010

(54) GROUP III NITRIDE SEMICONDUCTOR DEVICE, EPITAXIAL SUBSTRATE, AND METHOD OF FABRICATING GROUP III NITRIDE SEMICONDUCTOR DEVICE

(75) Inventors: Takashi Kyono, Itami (JP); Yusuke Yoshizumi, Itami (JP); Yohei Enya, Itami (JP); Katsushi Akita, Itami (JP); Masaki Ueno, Itami (JP); Takamichi Sumitomo, Itami (JP); Takao Nakamura, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/714,049

(22) Filed: Feb. 26, 2010

(65) Prior Publication Data

US 2010/0230690 A1    Sep. 16, 2010

Related U.S. Application Data

(63) Continuation of application No. PCT/JP2009/058182, filed on Apr. 24, 2009.

(30) Foreign Application Priority Data

Mar. 11, 2009    (JP) .......................... P2009-058057

(51) Int. Cl.
*H01L 29/24* (2006.01)
*H01L 33/00* (2006.01)
*H01L 29/06* (2006.01)
*H01L 31/0328* (2006.01)
*H01L 31/0336* (2006.01)
*H01L 31/072* (2006.01)
*H01L 31/109* (2006.01)
*H01L 29/739* (2006.01)

(52) U.S. Cl. .................... 257/101; 257/22; 257/102; 257/103; 257/189; 257/201; 257/E33.025; 257/E33.028; 257/E33.03; 257/E33.033; 257/E33.034

(58) Field of Classification Search .................. 257/22, 257/101–103, 189, 201, E33.025, E33.028, 257/E33.03, E33.033, E33.034
See application file for complete search history.

(56) References Cited

U.S. PATENT DOCUMENTS 7,462,882 B2 * 12/2008 Ueta et al. .................. 257/103

(Continued)

FOREIGN PATENT DOCUMENTS

JP    2000-044400 A    2/2000

(Continued)

OTHER PUBLICATIONS

Okamoto, Kuniyoshi et al: "Dislocation-Free *m*-Plane InGaN/GaN Light-Emitting Diodes on *m*-Plan GaN Single Crystals," Japanese Journal of Applied Physics, vol. 45, No. 45, 2006 pp. L1197-L1199.

(Continued)

*Primary Examiner*—Ida M Soward
(74) *Attorney, Agent, or Firm*—Venable LLP; Michael A. Sartori

(57) ABSTRACT

A group III nitride semiconductor device having a gallium nitride based semiconductor film with an excellent surface morphology is provided. A group III nitride optical semiconductor device 11*a* includes a group III nitride semiconductor supporting base 13, a GaN based semiconductor region 15, an active layer active layer 17, and a GaN semiconductor region 19. The primary surface 13*a* of the group III nitride semiconductor supporting base 13 is not any polar plane, and forms a finite angle with a reference plane Sc that is orthogonal to a reference axis Cx extending in the direction of a c-axis of the group III nitride semiconductor. The GaN based semiconductor region 15 is grown on the semipolar primary surface 13*a*. A GaN based semiconductor layer 21 of the GaN based semiconductor region 15 is, for example, an n-type GaN based semiconductor, and the n-type GaN based semiconductor is doped with silicon. A GaN based semiconductor layer 23 of an oxygen concentration of $5 \times 10^{16}$ cm$^{-3}$ or more provides an active layer 17 with an excellent crystal quality, and the active layer 17 is grown on the primary surface of the GaN based semiconductor layer 23.

29 Claims, 16 Drawing Sheets

U.S. PATENT DOCUMENTS

| | | |
|---|---|---|
| 2002/0011599 A1 | 1/2002 | Motoki et al. |
| 2002/0109146 A1 | 8/2002 | Yamada |
| 2004/0211355 A1 | 10/2004 | Motoki et al. |
| 2008/0308907 A1* | 12/2008 | Hirai et al. .................. 257/615 |
| 2009/0039356 A1* | 2/2009 | Iso et al. ....................... 257/76 |
| 2009/0072262 A1* | 3/2009 | Iza et al. ....................... 257/98 |
| 2009/0310640 A1* | 12/2009 | Sato et al. ............. 372/45.011 |
| 2010/0096615 A1* | 4/2010 | Okamoto et al. .............. 257/13 |

FOREIGN PATENT DOCUMENTS

| | | |
|---|---|---|
| JP | 2002-026464 A | 1/2002 |
| JP | 2002-231997 A | 8/2002 |
| JP | 2002-373864 A | 12/2002 |
| JP | 2004-363622 A | 12/2004 |
| JP | 2008-034658 A | 2/2008 |
| WO | WO-2008/075581 A1 | 6/2008 |

OTHER PUBLICATIONS

Asamizu, Hirokuni et al: "Continuous-Wave Operation of InGaN/GaN Laser Diodes on Semipolar (1122) Plane Gailium Nitrides," Applied Physics Express 2 (2009) 021002.

Fichtenbaum N. A. et al: "Impurity incorporation in heteroepitaxial N-face and Ga-face GaN films grown by metalorganic chemical vapor deposition," Journal of Crystal Growth 310 (2008), pp. 1124-1131.

* cited by examiner (a)

(b)

(c)

(a)

(b)

(a)

(b)

(a)

(b)

(b)

(a)

GROUP III NITRIDE SEMICONDUCTOR DEVICE, EPITAXIAL SUBSTRATE, AND METHOD OF FABRICATING GROUP III NITRIDE SEMICONDUCTOR DEVICE

CROSS REFERENCE TO RELATED APPLICATIONS

This is a continuation application PCT application No. PCT/JP2009/058182 filed on Apr. 24, 2009, claiming the benefit of priorities from Japanese Patent application 2009-058057 filed on Mar. 11, 2009, and incorporated by reference in their entirety.

TECHNICAL FIELD

The present invention relates to a group III nitride semiconductor device, an epitaxial substrate, and a method of fabricating the group III nitride semiconductor device.

BACKGROUND ART

Patent Literature 1 discloses an n-type GaN with an n-type carrier of a density proportional to its oxygen concentration. The GaN is epitaxially grown on a GaAs substrate using a source gas containing oxygen. Then the GaAs substrate is removed to obtain a free-standing GaN film.

Patent Literature 2 discloses a method of forming monocrystalline gallium nitride. This method allows the doping of oxygen as an n-type dopant.

Patent Literature 3 discloses a method of fabricating a GaN based compound semiconductor. Ammonia for use in fabricating of GaN based compound semiconductor is filled in a container so that part of the ammonia is condensed into liquid. The liquid ammonia contains water at a concentration of 0.5 vol. ppm or less as measured using Fourier transform infrared spectroscopy (FT-IR). In order to form a GaN based compound layer on the substrate, a gas material containing the ammonia is introduced to a reaction chamber to which the substrate has loaded.

CITATION LIST

Patent Literature 1: Japanese Unexamined Patent Application Publication No. 2000-044400
Patent Literature 2: Japanese Unexamined Patent Application Publication No. 2002-373864
Patent Literature 3: Japanese Unexamined Patent Application Publication No. 2004-363622

SUMMARY OF INVENTION

Technical Problems

According to the findings of the inventors, a gallium nitride surface that is different from c-plane of gallium nitride crystal facilitates the introduction of oxygen, which acts as a donor. This means that, when gallium nitride based semiconductor is grown on a semipolar or nonpolar primary surface of a gallium nitride substrate, in order to prevent an unexpected doping of oxygen that may impair the device performance, the oxygen concentration has to be controlled. This facilitating incorporation of oxygen into a facet also means that the doping with oxygen during the growth of the gallium nitride based semiconductor can stabilize the formation of a surface that is different from c-plane. In the growth of the gallium nitride based semiconductor onto the semipolar or nonpolar primary surface of a gallium nitride substrate, the gallium nitride based semiconductor has a crystal quality that depends on the concentration of oxygen.

From the viewpoint of device performances, when an epitaxial layer contains oxygen, acting as n-type dopant in gallium nitride based semiconductor, in a concentration range which is applied to n-type GaN substrates, the electrical performance of a semiconductor device with the epitaxial layer may be considerably affected by the oxygen. For example, in an optical semiconductor device, the luminance efficiency and electrical performance of the device considerably may depend on the amounts of oxygen with which an n-type gallium nitride based semiconductor layer, a light emitting layer and a p-type gallium nitride based semiconductor are doped.

The present invention is accomplished in view of the above situation, and it is an object to provide a group III nitride semiconductor device including a gallium nitride based semiconductor film with an excellent surface morphology, and a method of fabricating the same. It is another object of the present invention to provide an epitaxial substrate with the gallium nitride based semiconductor film having an excellent surface morphology.

Solution to Problem

A group III nitride semiconductor device according to one aspect of the present invention includes: (a) a group III nitride semiconductor supporting base made of a group III nitride semiconductor and having a primary surface, the primary surface forming a finite angle with a reference plane, the reference plane being orthogonal to a reference axis, and the reference axis extending in the direction of a c-axis of the group III nitride semiconductor; and (b) a gallium nitride based semiconductor region provided on the primary surface of the group III nitride semiconductor supporting base, the gallium nitride based semiconductor region having an oxygen concentration of from $5\times10^{16}$ cm$^{-3}$ to $5\times10^{18}$ cm$^{-3}$, the primary surface being one of semipolar and nonpolar, and the gallium nitride based semiconductor region including a first conductive type gallium nitride based semiconductor layer.

In the group III nitride semiconductor device, the gallium nitride based semiconductor region is provided on the semipolar or nonpolar surface and has an oxygen concentration of $5\times10^{16}$ cm$^{-3}$ or more, which provides the gallium nitride based semiconductor region with flat surface morphology. The gallium nitride based semiconductor region has a surface that is also semipolar or nonpolar according to the semipolar or nonpolar substrate primary surface. The gallium nitride based semiconductor region of an oxygen concentration exceeding $5\times10^{18}$ cm$^{-3}$ does not have excellent crystal quality. The gallium nitride based semiconductor region of an oxygen concentration equal to $1\times10^{17}$ cm$^{-3}$ or more has flatter surface morphology.

A group III nitride semiconductor device according to the present invention includes: (a) a group III nitride semiconductor supporting base made of a group III nitride semiconductor and having a primary surface, the primary surface forming a finite angle with a reference plane, the reference plane being orthogonal to a reference axis, and the reference axis extending in the direction of a c-axis of the group III nitride semiconductor; and (b) a gallium nitride based semiconductor region provided on the primary surface of the group III nitride semiconductor supporting base, the gallium nitride based semiconductor region having an oxygen concentration of from $5\times10^{16}$ cm$^{-3}$ to $5\times10^{18}$ cm$^{-3}$, the primary surface being one of semipolar and nonpolar, and the gallium nitride based semiconductor region including a first conductive type gallium nitride based semiconductor layer, and the active layer lies between the first conductive type gallium nitride based semiconductor layer and the second conductive type gallium nitride based semiconductor layer.

In the group III nitride semiconductor device, the gallium nitride based semiconductor region is provided on the semipolar or nonpolar surface and has an oxygen concentration of $5 \times 10^{16}$ cm$^{-3}$ or more, which provides the gallium nitride based semiconductor region with flat surface morphology. The gallium nitride based semiconductor region has a surface that is also semipolar or nonpolar according to the semipolar or nonpolar substrate primary surface. The gallium nitride based semiconductor region of an oxygen concentration exceeding $5 \times 10^{18}$ cm$^{-3}$ does not have excellent crystal quality. The oxygen concentration in the above range allows the active layer on the first conductive type gallium nitride based semiconductor layer to have satisfactory surface morphology. The gallium nitride based semiconductor region having an oxygen concentration over $1 \times 10^{17}$ cm$^{-3}$ has flatter surface morphology.

In a group III nitride semiconductor device according to one aspect of the present invention, the active layer has an oxygen concentration of $5 \times 10^{16}$ cm$^{-3}$ or more. In the group III nitride semiconductor device, the active layer having an oxygen concentration of $5 \times 10^{16}$ cm$^{-3}$ or more has flat surface morphology. Since oxygen acts as a donor, the active layer having an oxygen concentration of $5 \times 10^{16}$ cm$^{-3}$ or more provides the following advantages: the power for driving the device is reduced; and piezoelectric field in the active layer can be reduced. In a group III nitride semiconductor device according to an aspect of the present invention, the active layer has an oxygen concentration of $1 \times 10^{17}$ cm$^{-3}$ or more. In this group III nitride semiconductor device, the active layer having an oxygen concentration over $1 \times 10^{17}$ cm$^{-3}$ has flatter surface morphology.

In a group III nitride semiconductor device according to one aspect of the present invention, the active layer has an oxygen concentration of $5 \times 10^{18}$ cm$^{-3}$ or less. In the group III nitride semiconductor device, the active layer having an oxygen concentration exceeding $5 \times 10^{18}$ cm$^{-3}$ does not have excellent crystal quality. The active layer of an oxygen concentration exceeding $5 \times 10^{18}$ cm$^{-3}$ increases optical loss due to free carrier absorption therein.

In a group III nitride semiconductor device according to one aspect of the present invention, the second conductive type gallium nitride based semiconductor layer has an oxygen concentration of $5 \times 10^{16}$ cm$^{-3}$ or more. In the group III nitride semiconductor device, the second conductive type gallium nitride based semiconductor layer of an oxygen concentration of $5 \times 10^{16}$ cm$^{-3}$ or more has flat surface morphology. In a group III nitride semiconductor device according to one aspect of the present invention, the second conductive type gallium nitride based semiconductor layer has an oxygen concentration of $1 \times 10^{17}$ cm$^{-3}$ or more. In the group III nitride semiconductor device, the second conductive type gallium nitride based semiconductor layer having an oxygen concentration of $1 \times 10^{17}$ cm$^{-3}$ or more has flatter surface morphology.

In a group III nitride semiconductor device according to one aspect of the present invention, the second conductive type gallium nitride based semiconductor layer has an oxygen concentration of $5 \times 10^{18}$ cm$^{-3}$ or less. In the group III nitride semiconductor device, the second conductive type gallium nitride based semiconductor layer of an oxygen concentration exceeding $5 \times 10^{18}$ cm$^{-3}$ does not have excellent crystal quality. The second conductive type gallium nitride based semiconductor layer of an oxygen concentration exceeding $5 \times 10^{18}$ cm$^{-3}$ also does not have excellent conductivity.

In a group III nitride semiconductor device according to one aspect of the present invention, the first conductive type gallium nitride based semiconductor layer has a carbon concentration of $5 \times 10^{18}$ cm$^{-3}$ or less, the second conductive type gallium nitride based semiconductor layer has a carbon concentration of $5 \times 10^{18}$ cm$^{-3}$ or less, and the active layer has a carbon concentration of $5 \times 10^{18}$ cm$^{-3}$ or less. In the group III nitride semiconductor device, the carbon is inevitably incorporated into the gallium nitride based semiconductor in high concentration during its growth, and incorporating carbon in the growth promotes the formation of stable c-plane facet. Lowering carbon concentration in the gallium nitride based semiconductor in its growth suppresses the formation of the facet in the gallium nitride semiconductor. The definition of the carbon concentration herein does not include carbon that contaminates the surface of gallium nitride semiconductor after its deposition.

A group III nitride semiconductor device according to one aspect of the present invention further includes another second conductive type gallium nitride based semiconductor layer. The second conductive type gallium nitride based semiconductor layer has a band gap wider than that of the other second conductive type gallium nitride based semiconductor layer, and the oxygen concentration of the second conductive type gallium nitride based semiconductor layer is higher than that of the active layer. The second conductive type gallium nitride based semiconductor layer is provided between the other second conductive type gallium nitride based semiconductor layer and the active layer, and forms a junction with the other second conductive type gallium nitride based semiconductor layer.

In the group III nitride semiconductor device, since the second conductive type gallium nitride based semiconductor layer has an oxygen concentration higher than that of the active layer, the second conductive type gallium nitride based semiconductor layer forms a flat junction interface with the other second conductive type gallium nitride based semiconductor layer, resulting in reduction of scattering loss.

A group III nitride semiconductor device according to one aspect of the present invention further includes an optical guide layer provided between the active layer and the second conductive type gallium nitride based semiconductor layer, and the optical guide layer is composed of gallium nitride semiconductor. The active layer extends in a plane inclined at an angle to the reference plane, and the second conductive type gallium nitride based semiconductor layer can be an electron block layer.

In the group III nitride semiconductor device, the active layer, the optical guide layer, and the second conductive type gallium nitride based semiconductor layer are arranged on a semipolar or nonpolar surface, and thereby these semiconductor layers have piezoelectric fields smaller than those of semiconductor layers arranged on a c-plane. Since the smaller piezoelectric polarization suppresses the overflow of carriers on the primary surface, a p-type semiconductor layer can be doped with oxygen, which acts as a donor, in order to obtain its flatness. Accordingly, the present invention provides high carrier injection efficiency as well as a p-type semiconductor layer having flat surface morphology due to the doping with oxygen.

In a group III nitride semiconductor device of the present invention, the active layer includes well layers and barrier layers alternately arranged, and the well layers have an oxygen concentration of $6 \times 10^{17}$ cm$^{-3}$ or less. In the group III nitride semiconductor device, the active layer of a higher oxygen concentration increases the optical loss due to free carrier absorption therein. The well layers of an oxygen concentration of $6\times10^{17}$ cm$^{-3}$ or less, however, suppress the effective optical loss, and avoid the reduction in luminance efficiency due to the poor crystal quality thereof.

In a group III nitride semiconductor device according to one aspect of the present invention, the primary surface has a normal line extending at an angle of from 10 to 170 degrees with reference to the reference axis. In the group III nitride semiconductor device, contribution from a surface that is not any polar plane is appropriately effective. The property of polarity in the surface that is not any polar plane herein encompasses semi-polarity and non-polarity.

In a group III nitride semiconductor device according to one aspect of the present invention, the primary surface has a normal line extending at an angle of from 10 to 80 degrees relative to the reference axis, and alternately, the primary surface has a normal line extending at an angle of from 100 to 170 degrees relative to the reference axis. In the group III nitride semiconductor device, the semipolar or nonpolar contribution is appropriately effective.

In a group III nitride semiconductor device according to one aspect of the present invention, the primary surface has a normal line extending at an angle of from 63 to 80 degrees relative to the reference axis, and alternately the primary surface has a normal line extending at an angle of from 100 to 117 degrees relative to the reference axis. In the group III nitride semiconductor device, the off-angle in one of the above ranges particularly leads to the reduction in piezoelectric polarization, resulting in suppressing overflow of carriers.

Another aspect of the present invention provides an epitaxial wafer for a group III nitride semiconductor device. The epitaxial wafer includes: (a) a group III nitride semiconductor substrate having a primary surface, the group III nitride semiconductor substrate being composed of a group III nitride semiconductor, and the primary surface being tilted at a finite angle with reference to a reference plane, the reference plane being orthogonal to a reference axis extending in the direction of a c-axis of the group III nitride semiconductor; and (b) a first conductive type gallium nitride based semiconductor layer having an oxygen concentration of from $5\times10^{16}$ cm$^{-3}$ to $5\times10^{18}$ cm$^{-3}$ or less, the first conductive type gallium nitride based semiconductor layer being provided on the primary surface of the group III nitride semiconductor substrate; (c) a light emitting layer provided on the first conductive type gallium nitride based semiconductor layer; and (d) a second conductive type gallium nitride based semiconductor layer provided on the light emitting layer. The primary surface has one of semi-polarity and non-polarity.

In this epitaxial wafer, when the first conductive type gallium nitride based semiconductor layer is provided on the semipolar or nonpolar surface and has an oxygen concentration of $5\times10^{16}$ cm$^{-3}$ or more, the first conductive type gallium nitride based semiconductor layer is provided with flat surface morphology, which the light emitting layer can be provided on the first conductive type gallium nitride based semiconductor layer of satisfactory surface morphology. The first conductive type gallium nitride based semiconductor layer also has a semipolar or nonpolar surface. The first conductive type gallium nitride based semiconductor layer of an oxygen concentration exceeding $5\times10^{18}$ cm$^{-3}$ does not have excellent crystal quality.

The epitaxial wafer according to another aspect of the present invention further includes another second conductive type gallium nitride based semiconductor layer. The second conductive type gallium nitride based semiconductor layer has a band gap wider than that of the other second conductive type gallium nitride based semiconductor layer, and its oxygen concentration is higher than that of the light emitting layer. The second conductive type gallium nitride based semiconductor layer is provided between the other second conductive type gallium nitride based semiconductor layer and the light emitting layer, and forms a junction with the other second conductive type gallium nitride based semiconductor layer.

In the epitaxial wafer, the second conductive type gallium nitride based semiconductor layer has a band gap wider than that of the other second conductive type gallium nitride based semiconductor layer, and is provided between the other second conductive type gallium nitride based semiconductor layer and the light emitting layer, whereby the second conductive type gallium nitride based semiconductor layer serves as an electron block layer, whereas the other second conductive type gallium nitride based semiconductor layer serves as a cladding layer. Since the second conductive type gallium nitride based semiconductor layer has an oxygen concentration higher than that of the light emitting layer, the junction interface formed by the second conductive type gallium nitride based semiconductor layer and the other second conductive type gallium nitride based semiconductor layer has excellent flatness. This excellent flatness results in the reduction of scattering loss at the interface between the second conductive type gallium nitride based semiconductor layer and the other second conductive type gallium nitride based semiconductor layer.

In the epitaxial wafer according to another aspect of the present invention, the second conductive type gallium nitride based semiconductor layer has an oxygen concentration of $5\times10^{16}$ cm$^{-3}$ or more, and the second conductive type gallium nitride based semiconductor layer has an oxygen concentration of $5\times10^{18}$ cm$^{-3}$ or less. The second conductive type gallium nitride based semiconductor layer is an electron block layer, and the light emitting layer includes an active layer having well layers and barrier layers alternately arranged. The light emitting layer further includes an optical guide layer composed of gallium nitride semiconductor, and the optical guide layer is provided between the active layer and the second conductive type gallium nitride based semiconductor layer, and extends along a plane inclined at an angle with reference to the reference plane. In the epitaxial wafer according to another aspect of the present invention, the second conductive type gallium nitride based semiconductor layer has an oxygen concentration of $1\times10^{17}$ cm$^{-3}$ or more.

In the epitaxial wafer, since the active layer, the optical guide layer and the second conductive type gallium nitride based semiconductor layer are arranged on a semipolar or nonpolar surface, these semiconductor layers have piezoelectric fields smaller than those of semiconductor layers arranged on a c-plane. From the viewpoint of carrier compensation, doping the p-type semiconductor layer with oxygen of donor impurity is not desirable, but the substrate primary surface permits small piezoelectric polarization owing to its semipolar or nonpolar surface, resulting in suppressing the overflow of carriers. Accordingly, although having an oxygen concentration of from $5\times10^{16}$ cm$^{-3}$ to $5\times10^{18}$ cm$^{-3}$, the second conductive type gallium nitride based semiconductor layer can avoid the reduction in carrier migration efficiency.

In the epitaxial wafer according to another aspect of the present invention, the normal line of the primary surface forms an angle of from 10 to 80 degrees with the reference axis, and alternatively the normal line of the primary surface forms an angle of from 100 to 170 degrees with the reference axis. In the epitaxial wafer according to another aspect of the present invention, the normal line of the primary surface and the reference axis form an angle of from 63 to 80 degrees relative to the reference plane, and alternatively the normal line of the primary surface and the reference axis form an angle of from 100 to 117 degrees relative to the reference plane.

A further aspect of the present invention provides a method of fabricating a group III nitride semiconductor device. The method includes the steps of: (a) preparing a group III nitride semiconductor substrate made of a group III nitride semiconductor and having a primary surface; (b) supplying a group III source and a nitrogen source to a growth reactor to grow a first conductive type gallium nitride based semiconductor layer on the primary surface of the group III nitride semiconductor substrate, the first conductive type gallium nitride based semiconductor layer having an oxygen concentration of from $5 \times 10^{16}$ cm$^{-3}$ to $5 \times 10^{18}$ cm$^{-3}$; (c) supplying a group III source and a nitrogen source to the growth reactor to grow a light emitting layer on the first conductive type gallium nitride based semiconductor layer; and (d) supplying a group III source and a nitrogen source to the growth reactor to grow a second conductive type gallium nitride based semiconductor layer on the light emitting layer. The primary surface is one of semipolar and nonpolar. Oxygen in the first conductive type gallium nitride based semiconductor layer is provided as an impurity contained in at least one of the group III source and the nitrogen source. The primary surface of the group III nitride semiconductor substrate forms a finite angle with a reference plane, the reference plane is orthogonal to a reference axis, and the reference axis extends in a direction of a c-axis of the group III nitride semiconductor.

Growing a gallium nitride based semiconductor layer of an oxygen concentration of $5 \times 10^{16}$ cm$^{-3}$ or more on the semipolar or nonpolar surface makes the surface morphology of this gallium nitride based semiconductor layer flat.

This prevents the surface of the first conductive type gallium nitride based semiconductor layer from having a c-plane, and allows the surface of the gallium nitride based semiconductor layer to have a polarity corresponding to that of the substrate primary surface. The gallium nitride based semiconductor region of an oxygen concentration exceeding $5 \times 10^{18}$ cm$^{-3}$ does not have excellent crystal quality. This method allows the growth of the light emitting layer on the first conductive type gallium nitride based semiconductor layer having satisfactory surface morphology. The gallium nitride based semiconductor layer of an oxygen concentration of $1 \times 10^{17}$ cm$^{-3}$ or more have flatter surface morphology.

In the method according to the present invention, the nitrogen source comprises ammonia, and the nitrogen source comprises water as an impurity. The light emitting layer has an oxygen concentration of $5 \times 10^{16}$ cm$^{-3}$ or more, the light emitting layer has an oxygen concentration of $5 \times 10^{18}$ cm$^{-3}$ or less, the second conductive type gallium nitride based semiconductor layer has an oxygen concentration of $5 \times 10^{16}$ cm$^{-3}$ or more, and the second conductive type gallium nitride based semiconductor layer has an oxygen concentration of $5 \times 10^{18}$ cm$^{-3}$ or less. The second conductive type gallium nitride based semiconductor layer preferably has an oxygen concentration higher than that of the light emitting layer.

This method can suppress the formation of a certain facet inappropriate to the polarity of the primary surface during the growth of a gallium nitride semiconductor containing oxygen on the primary surface. This provides flat surface morphology. In a method according to the present invention, the light emitting layer has an oxygen concentration of $1 \times 10^{17}$ cm$^{-3}$ or more. In a method according to the present invention, the light emitting layer has an oxygen concentration of $5 \times 10^{18}$ cm$^{-3}$ or less, and the second conductive type gallium nitride based semiconductor layer may have an oxygen concentration of $1 \times 10^{17}$ cm$^{-3}$ or more. This method provides further flat surface morphology.

In the method according to the present invention, the second conductive type gallium nitride based semiconductor layer preferably is grown at a temperature lower than that for the first conductive type gallium nitride based semiconductor layer. This method can reduce the thermal stress to the light emitting layer by decreasing the growth temperature of the second conductive type gallium nitride based semiconductor layer.

In the method according to the present invention, the light emitting layer includes an InAlGaN layer. The InAlGaN layer may have an oxygen concentration that can be controlled by adjusting the aluminum content to obtain an appropriate band gap depending on its In content. Alternatively, in a method according to the present invention, the light emitting layer includes an InGaN layer.

In the method according to the present invention, ammonia containing water at 500 ppb % or less may be used as the nitrogen source. In the method according to the present invention, ammonia containing water at 50 ppb % or less may be used as the nitrogen source. In the method according to the present invention, the nitrogen source is ammonia containing water at 1 ppb % or less.

In the method according to the present invention, the nitrogen source is supplied to a growth reactor after the water concentration in the nitrogen source is adjusted using a refinery provided between a stock of the nitrogen source and the growth reactor. The nitrogen source may contain ammonia. In the method according to the present invention, the nitrogen source may contain water at 1 ppb % or less. The oxygen concentration in the semiconductor layer can be controlled by adjusting the water concentration in the nitrogen source. Similarly, the oxygen concentration in the semiconductor layer can be controlled by adjusting the water concentration in the group III source.

The object and other objects, aspects and advantages of the present invention will become fully apparent through the preferred embodiments of the invention described in detail below with reference to the attached drawings.

ADVANTAGEOUS EFFECTS OF INVENTION

As described above, an aspect of the present invention provides a group III nitride semiconductor device including a gallium nitride semiconductor film with excellent surface morphology. Another aspect of the present invention provides a method of fabricating the group III nitride semiconductor device. A further aspect of the present invention provides an epitaxial substrate including a gallium nitride semiconductor film with excellent surface morphology.

DESCRIPTION OF EMBODIMENTS

Figure 1:
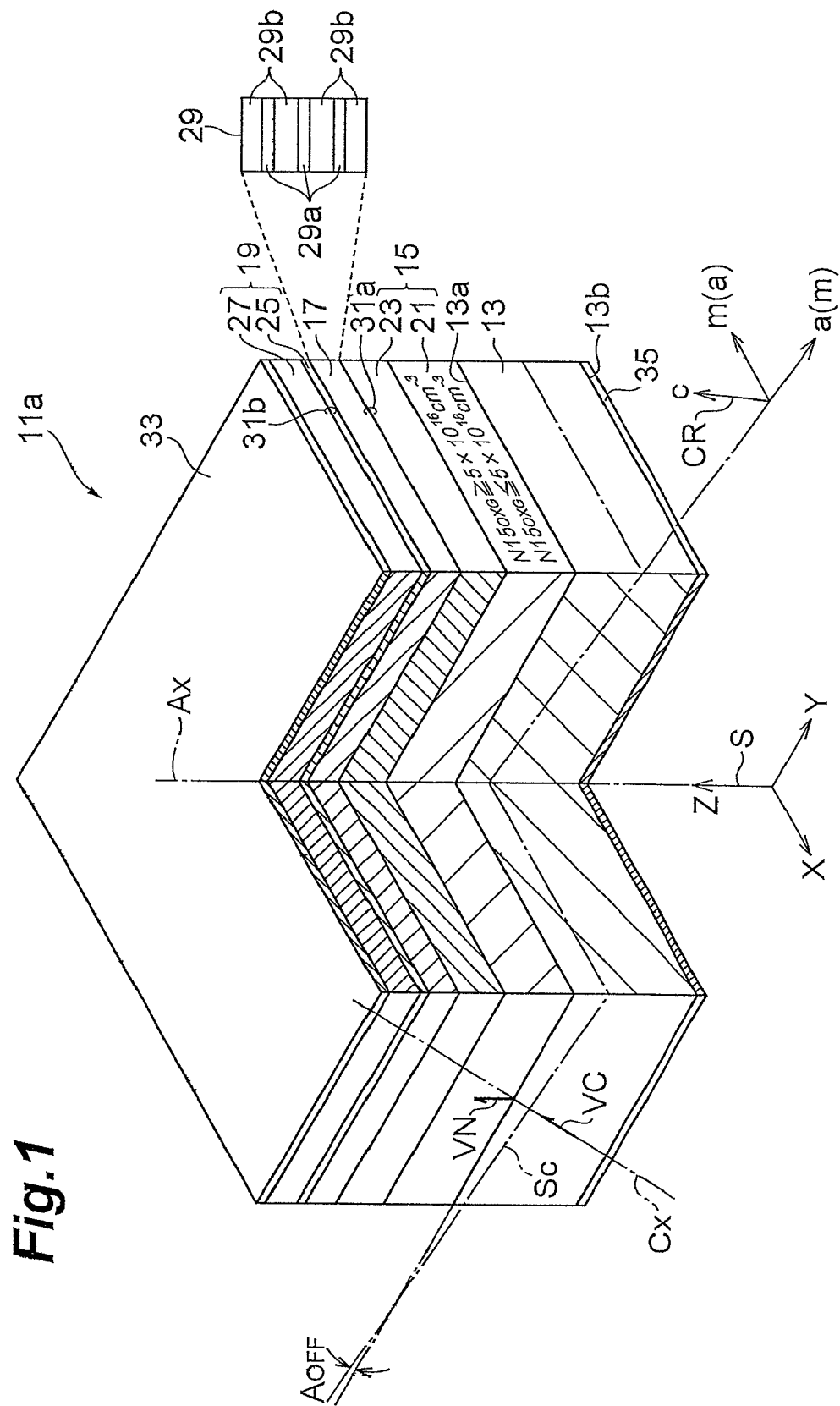
FIG. 1 is a schematic view illustrating a group III nitride optical semiconductor device according to the present embodiment.

The invention will be easily understood taking into consideration of the following detailed description with reference to the attached drawings shown by way of examples. The preferred embodiments of the present invention of a group III nitride semiconductor device, an epitaxial substrate, and a method of making a group III nitride semiconductor device and the epitaxial substrate will be explained below in reference to the attached drawings. The same reference numerals refer to the same parts in the drawings, wherever possible. An optical semiconductor device will be described below as an example of the semiconductor device.

FIG. 1 schematically illustrates a group III nitride optical semiconductor device according to the present embodiment. The group III nitride optical semiconductor device shown in FIG. 1 has a structure applicable to a light emitting diode for example. The group III nitride optical semiconductor device 11a includes a group III nitride semiconductor supporting base 13, a gallium nitride based semiconductor region 15, an active layer 17, and a gallium nitride based semiconductor region 19. The group III nitride semiconductor supporting base 13 is composed of a group III nitride semiconductor such as GaN, InGaN, and AlGaN. The group III nitride semiconductor supporting base 13 has a primary surface 13a and a back surface 13b. The primary surface 13a of the group III nitride semiconductor supporting base 13 is not any polar plane, which means one of semi-polarity and non-polarity.

When the primary surface 13a of the group III nitride semiconductor supporting base 13 has non-polarity, the primary surface 13a may be an a-plane or m-plane of the group III nitride semiconductor, or may be a plane tilting from the a-plane or m-plane by a rotation about the c-axis. When the primary surface 13a of the group III nitride semiconductor supporting base 13 is semipolar, the primary surface 13a may be a semipolar plane tilting from the reference plane Sc that is orthogonal to a reference axis Cx extending in the direction of the c-axis of the group III nitride semiconductor.

The reference plane Sc is typically a c-plane. The reference plane Sc is orthogonal to the direction of a c-axis vector VC, and the primary surface 13a is illustrated with a normal vector VN. The c-axis vector VC is directed at an angle $A_{off}$ with reference to the normal vector VN. The angle $A_{off}$ is a so-called "off-angle" relative to the c-plane. Referring to FIG. 1, a crystal coordinate system CR includes an a-axis, an m-axis and the c-axis of crystal axes for the hexagonal system of the group III nitride semiconductor: the c-plane of a hexagonal system is referred to as "(0001)", and the surface orientation referred to as "(000-1)" is directed opposite to the (0001) plane. The Cartesian coordinate system S includes geometrical coordinate axes X, Y, and Z. Each of these axes may be tilted with reference to the a-axis or the m-axis, for example. The gallium nitride based semiconductor region 15, the active layer 17 and the gallium nitride based semiconductor region 19 are arranged along the axis Ax on the primary surface that is not any polar plane. The angle formed by the normal vector VN of the primary surface 13a and the reference axis Cx may be in the range of 10 to 170 degrees with reference to the reference plane Sc.

The gallium nitride based semiconductor region 15 is provided on the primary surface 13a. The gallium nitride based semiconductor region 15 has an oxygen concentration of $5 \times 10^{16}$ cm$^{-3}$ to $5 \times 10^{18}$ cm$^{-3}$. The oxygen concentration can be controlled by the concentration of impurities contained in the source, the off-angle of substrate, the growth temperature, and the composition of mixed crystal, for example. The gallium nitride based semiconductor region 15 preferably has an oxygen concentration of $1 \times 10^{17}$ cm$^{-3}$ or more. The gallium nitride based semiconductor region 15 may include one or more gallium nitride based semiconductor layers. In an example, the gallium nitride based semiconductor region 15 is composed of a gallium nitride based semiconductor layer 21 of the first conductive type and a gallium nitride based semiconductor layer 23. The gallium nitride based semiconductor layer 21 may be, for example, an n-type semiconductor layer, whereas the gallium nitride based semiconductor layer 23 may be, for example, a buffer layer. The first conductive type gallium nitride based semiconductor layer 21 is composed of an n-type gallium nitride based semiconductor, for example, and the n-type gallium nitride semiconductor is doped with an n-type dopant, such as silicon. The n-type gallium nitride semiconductor is composed of GaN, AlGaN, InGaN or InAlGaN, for example. The gallium nitride based semiconductor layer 23 is composed of an undoped gallium nitride semiconductor, for example. The gallium nitride based semiconductor is composed of InGaN, InAlGaN or GaN, for example. In the gallium nitride based semiconductor layer 23 that has an oxygen concentration of $5 \times 10^{16}$ cm$^{-3}$ or more, the active layer 17 grown on the primary surface of the gallium nitride based semiconductor layer 23 has an excellent crystal quality, thereby providing an excellent interface between the gallium nitride based semiconductor layer 23 and the gallium nitride semiconductor grown on the primary surface of the semiconductor layer. In the gallium nitride based semiconductor layer 23 that has an oxygen concentration of $1 \times 10^{17}$ cm$^{-3}$ or more, growing the active layer 17 on the primary surface of the gallium nitride based semiconductor layer 23 provides a more excellent crystal quality.

The gallium nitride based semiconductor region 19 may include one or more gallium nitride based semiconductor layers, and the gallium nitride based semiconductor region 19 of the present example is composed of a gallium nitride based semiconductor layer 25 and a second conductive type gallium nitride based semiconductor layer 27. The gallium nitride based semiconductor layer 25 may be composed of, for example, an undoped or p-type gallium nitride semiconductor. The second conductive type gallium nitride based semiconductor layer 27 may be composed of, for example, a p-type gallium nitride semiconductor, and this p-type gallium nitride semiconductor may be doped with a p-type dopant such as magnesium. The p-type gallium nitride semiconductor may be composed of, for example, GaN, AlGaN, InAlGaN or InGaN. The second conductive type gallium nitride based semiconductor layer 25 may be, for example, an electron block layer, whereas the gallium nitride based semiconductor layer 27 may be, for example, a p-type contact layer. The active layer 17 is provided between the gallium nitride based semiconductor layer 21 and the gallium nitride based semiconductor layer 27. The active layer 17 is formed on the gallium nitride based semiconductor region 15, and the gallium nitride based semiconductor region 19 is formed on the active layer 17.

In the group III nitride optical semiconductor device 11a, when the gallium nitride based semiconductor region 15 is provided on the primary surface 13a and has an oxygen concentration of $5 \times 10^{16}$ cm$^{-3}$ or more, the gallium nitride based semiconductor region 15 has a primary surface 15a with flat surface morphology. In the gallium nitride based semiconductor region 15 that has an oxygen concentration of $1 \times 10^{17}$ cm$^{-3}$ or more, the primary surface 15a has flatter surface morphology. This prevents the formation of a c-plane facet in the surface 15a of the gallium nitride based semiconductor region 15, and provides the entire primary surface 15a of the gallium nitride based semiconductor region 15 with a polarity associated with that of the substrate primary surface 13a (i.e., semipolar or nonpolar). The gallium nitride based semiconductor region 15 of an oxygen concentration exceeding $5 \times 10^{18}$ cm$^{-3}$ does not have excellent crystal quality. When the oxygen concentration of the nitride based semiconductor region 15 falls within the above range, the active layer 17 can be grown on the nitride based semiconductor region 15 of satisfactory surface morphology, whereby an interface 31a between the gallium nitride based semiconductor region 15 and the active layer 17 is made flat.

It is thought that doping with oxygen stabilizes the creation of the plane that is not any c-plane. Accordingly, the crystal growth of the gallium nitride based semiconductor region 15 on the primary surface can be achieved while the growing surface of the gallium nitride based semiconductor region 15 is kept to be a surface which is not polar (semipolar or nonpolar), resulting in excellent surface morphology. The supply of oxygen is not limited to intentional doping by use of a separate oxygen source as a dopant, but may use the source gas that contains controlled amounts of impurity of oxygen. Controlling the amount of oxygen incorporated into the semipolar or nonpolar surface allows for flat surface morphology of the gallium nitride based semiconductor region, which is used as the base for the active layer 17.

The active layer 17 containing oxygen of $5 \times 10^{16}$ cm$^{-3}$ or more has flat surface morphology. The active layer 17 containing oxygen of $5 \times 10^{18}$ cm$^{-3}$ or less has excellent crystal quality. The improvement of the surface flatness of the active layer 17 leads to reduction of nonuniform emission of the light emitting diode. The active layer 17 containing oxygen of $1 \times 10^{17}$ cm$^{-3}$ or more has further flat surface morphology. The further improvement of the surface flatness leads to further reduction of nonuniform emission of the light emitting diode.

The active layer 17 of the group III nitride optical semiconductor device 11a may have a quantum well structure 29 with well layers 29a and barrier layers 29b alternately arranged. The well layers 29a are composed of GaN, AlGaN, InGaN or InAlGaN, for example, whereas the barrier layers 29b are composed of GaN, AlGaN, InGaN or InAlGaN, for example. The well layers 29a of the active layer 17 may have an oxygen concentration of $6 \times 10^{17}$ cm$^{-3}$ or less. The well layers 29a having a higher oxygen concentration increase the optical loss due to free carrier absorption therein. The well layers 29a having an oxygen concentration of $6 \times 10^{17}$ cm$^{-3}$ or less, however, suppress the optical loss, and avoid the reduction in luminance efficiency due to crystal quality which is not good. The barrier layers 29b of an oxygen concentration higher than that of the well layers 29a have excellent surface morphology. This enables the growth of the well layers 29a on the barrier layers 29b with excellent surface morphology.

The active layer 17 may include one or more InAlGaN layers which are used as the well layers 29a and/or the barriers layers 29b. The oxygen concentration of the InAlGaN layers can be controlled by adjusting the aluminum content, and adjusting its In content enables to provide InAlGaN layers with an appropriate band gap. Alternatively, the active layer 17 may include one or more InGaN layers which are used as the well layers 29a and/or the barrier layers 29b. The band gap of InGaN is easily adjustable, and its oxygen concentration can be controlled by the deposition conditions, such as growth temperature and the concentration of impurity in sources.

When the active layer 17 has an oxygen concentration of $5 \times 10^{16}$ cm$^{-3}$ or more, the second conductive type gallium nitride based semiconductor layers 25 and 27, which are grown on the primary surface of the active layer 17, have excellent crystal quality. This provides a flat interface between the active layer 17 and the gallium nitride semiconductor grown on the primary surface of this semiconductor layer. The active layer 17 having an oxygen concentration of $1 \times 10^{17}$ cm$^{-3}$ or more provides the second conductive type gallium nitride based semiconductor layers 25 and 27 with more excellent crystal quality, and the interface therebetween with more excellent flatness.

When the gallium nitride based semiconductor layer 25 contains oxygen of $5 \times 10^{16}$ cm$^{-3}$ or more, its surface morphology is made flat. When the gallium nitride based semiconductor layer 25 contains oxygen of $1 \times 10^{17}$ cm$^{-3}$ or more, its surface morphology is made much flatter. The gallium nitride based semiconductor layer 25 may have an oxygen concentration of $5 \times 10^{18}$ cm$^{-3}$ or less. The oxygen concentration exceeding $5 \times 10^{18}$ cm$^{-3}$ may impair the crystal quality of the gallium nitride based semiconductor layer 25.

When the gallium nitride based semiconductor layer 27 contains oxygen of $5 \times 10^{16}$ cm$^{-3}$ or more, its surface morphology is made flat. When the gallium nitride based semiconductor layer 27 contains oxygen of $1 \times 10^{17}$ cm$^{-3}$ or more, its surface morphology is made much flatter. The gallium nitride based semiconductor layer 27 may have an oxygen concentration of $5 \times 10^{18}$ cm$^{-3}$ or less. The oxygen concentration exceeding $5 \times 10^{18}$ cm$^{-3}$ impairs the crystal quality of the gallium nitride based semiconductor layer 27. The gallium nitride based semiconductor layer 25 of an oxygen concentration higher than that of the gallium nitride based semiconductor layer 27 has flat surface morphology, resulting in excellent crystal quality of the gallium nitride based semiconductor layer 27 that is formed on the gallium nitride based semiconductor layer 25. When the oxygen concentration of the gallium nitride based semiconductor layer 25 is lower than that of the gallium nitride based semiconductor layer 27, the compensation of p-type conduction due to oxygen doped in the gallium nitride based semiconductor layer 25 is reduced, resulting in its improved carrier injection efficiency.

In the formation of gallium nitride semiconductor on a semipolar or nonpolar surface, the incorporation of carbon into growing gallium nitride semiconductor at high concentration can facilitate the formation of a c-plane facet, which is stable. Reducing the carbon concentration in the growth of the gallium nitride semiconductor can prevent the formation of the facet in the gallium nitride semiconductor. Accordingly, the gallium nitride based semiconductor layers 21 and gallium nitride based semiconductor layer 23 preferably have a concentration of carbon of $5\times10^{18}$ cm$^{-3}$ or less. The concentration of carbon in the gallium nitride based semiconductor layers 25 and 27 may be $5\times10^{18}$ cm$^{-3}$ or less, and the concentration of carbon in the active layer 17 may be $5\times10^{18}$ cm$^{-3}$ or less. The above carbon is supplied from, for example, an organic metal source. The concentration of carbon can be controlled by impurity concentration in raw material sources, doping source gases with carbon, off-angle of substrate, growth temperature, and deposition pressure, for example.

In the group III nitride optical semiconductor device 11a, the gallium nitride based semiconductor layer (e.g., electron block layer) 25 has a band gap wider than that of the gallium nitride based semiconductor layer (e.g., p-type contact layer) 27, and the gallium nitride based semiconductor layer 25 is provided between the gallium nitride based semiconductor layer 27 and the active layer 17. The gallium nitride based semiconductor layer 25 forms a junction 31b with the gallium nitride based semiconductor layer 27. When the gallium nitride based semiconductor layer 25 has an oxygen concentration higher than that of the active layer 17, the junction interface 31b is made flat.

In the group III nitride optical semiconductor device 11a, a first electrode (e.g., anode) 33 is formed on the gallium nitride based semiconductor layer 27. Since this gallium nitride based semiconductor layer 27 is formed on the flat junction 31a, the gallium nitride based semiconductor layer 27 has satisfactory crystal quality, thereby providing satisfactory contact characteristics.

In the group III nitride optical semiconductor device 11a, the angle $A_{off}$ of the primary surface 13a is equal to 10 degrees or more and equal to 80 degrees or less, where the angle $A_{off}$ is defined with reference to the reference plane Sc. The angle $A_{off}$ of the primary surface 13a may be equal to 100 degrees or more, and equal to 170 degrees or less with reference to the reference plane Sc. In this group III nitride optical semiconductor device 11a, contribution from the semipolar of the primary surface 13a is appropriately effective. On the back surface 13b of the supporting base 13, a second electrode (e.g., cathode) 35 is provided. Alternatively, in the group III nitride optical semiconductor device 11a, the primary surface 13a may be a nonpolar plane. In this group III nitride optical semiconductor device 11a, contribution from the nonpolar of the primary surface 13a is appropriately effective.

In the group III nitride optical semiconductor device 11a, the group III nitride optical semiconductor device 11a includes the active layer 17 and the gallium nitride based semiconductor layer 27 arranged on the primary surface 13a, so that piezoelectric fields in these semiconductor layers are smaller than those of semiconductor layers similarly arranged on a c-plane. Although the doping of the p-type semiconductor layer with oxygen that acts as a donor is not desirable, the doping with oxygen in an appropriate amount can provide the satisfactory contact characteristics.

In the group III nitride optical semiconductor device 11a, the angle $A_{off}$, tilted with reference to the reference plane Sc, may fall within the range of from 63 to 80 degrees. The angle $A_{off}$ may be from 100 to 117 degrees with reference to the reference plane Sc. The group III nitride optical semiconductor device 11a, particularly at an angle $A_{off}$ in the above range, reduces the effect of piezoelectric polarization.

Figure 2:
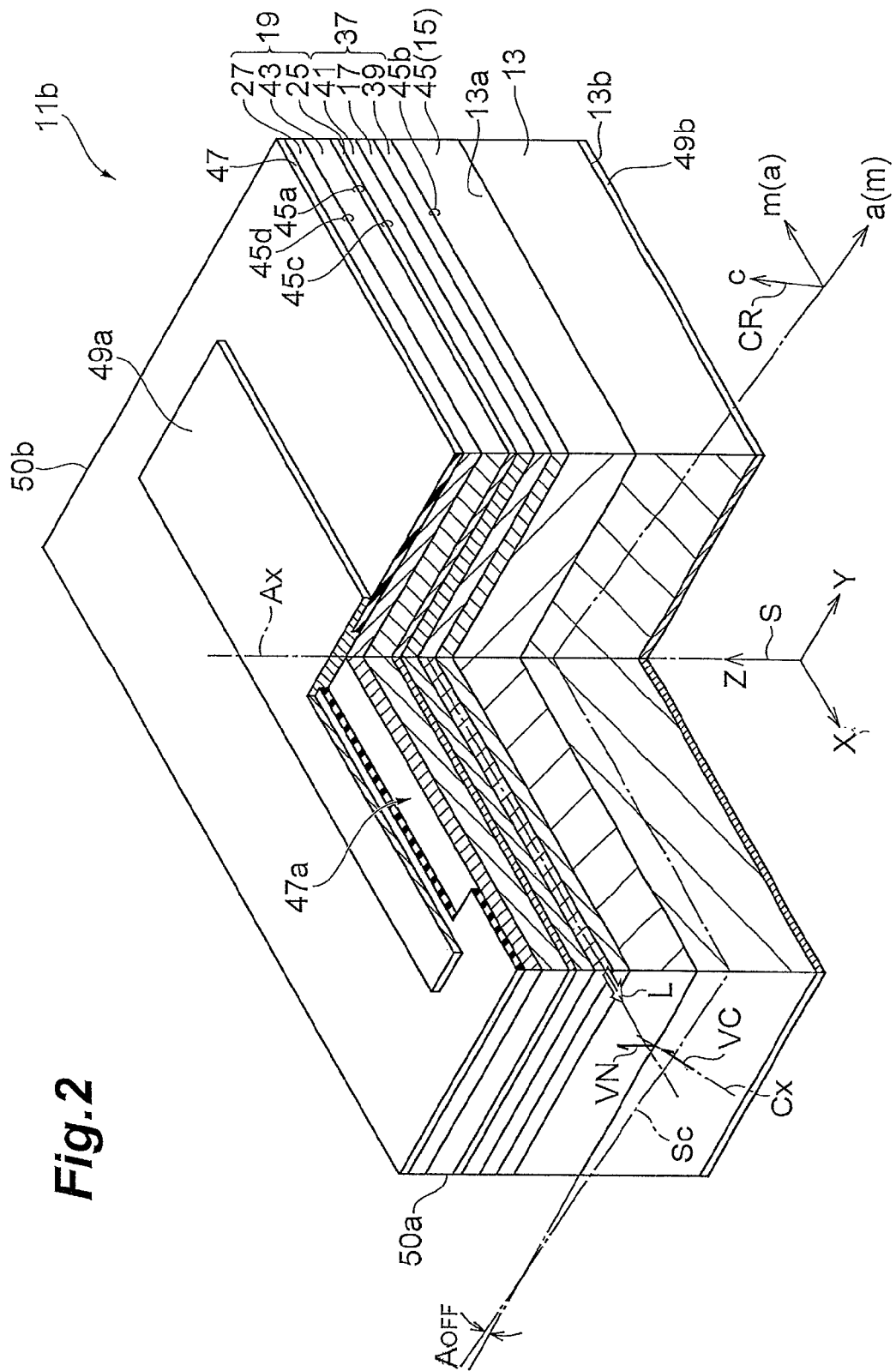
FIG. 2 is a schematic view illustrating a group III nitride optical semiconductor device according to the present embodiment.

FIG. 2 schematically illustrates a group III nitride optical semiconductor device according to the present embodiment. The group III nitride optical semiconductor device shown in FIG. 2 has a structure applicable to, for example, a semiconductor laser. A group III nitride optical semiconductor device 11b includes a group III nitride semiconductor supporting base 13, a gallium nitride based semiconductor region 15, a light emitting layer 37, and a gallium nitride based semiconductor region 19. In the present example, the light emitting layer 37 may include an active layer 17, and first and second optical guide layers 39 and 41. The active layer 17 is provided between the first optical guide layer 39 and the second optical guide layer 41. The optical guide layers 39 and 41 are composed of gallium nitride based semiconductor, which may be undoped for example.

Figure 3:
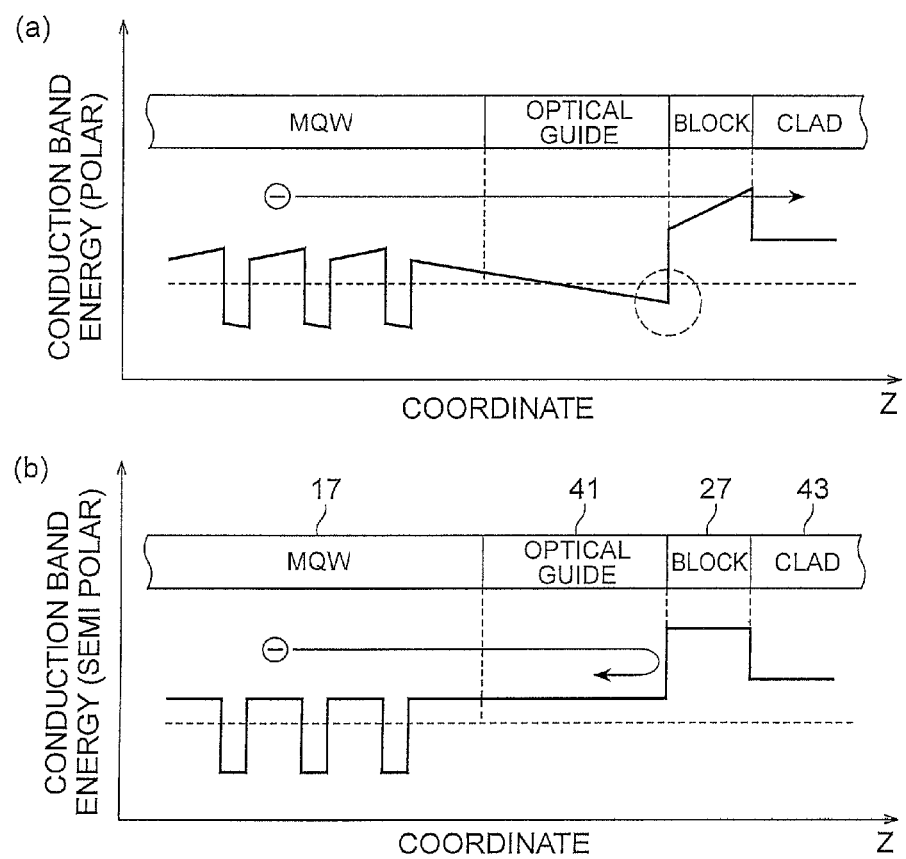
FIG. 3 is a view showing band diagrams of an active layer, a optical guide layer, and a p-type gallium nitride based semiconductor layer, on a c-plane and a semipolar plane.

In the group III nitride optical semiconductor device 11b, the active layer 17, the optical guide layers 39 and 41, and the gallium nitride based semiconductor layer 19 are arranged on the semipolar or nonpolar surface, and thereby have piezoelectric fields smaller than those of semiconductor layer similarly arranged on a c-plane, as shown in Part (a) and (b) of FIG. 3. The introduction of oxygen, acting as a donor, into the p-type semiconductor layer is not desirable, but the semipolar or nonpolar surface enables smaller piezoelectric polarization that suppresses overflow of carriers. Accordingly, although the oxygen concentration tends to be high, the reduction in carrier injection efficiency can be suppressed.

Each of the first and second optical guide layers 39 and 41 preferably has an oxygen concentration of $5\times10^{16}$ cm$^{-3}$ or more for the reason described above. Each of the first and second optical guide layers 39 and 41 preferably has an oxygen concentration of $5\times10^{18}$ cm$^{-3}$ or less for the reason described above.

The gallium nitride based semiconductor region 19 may include still another second conductive type gallium nitride based semiconductor layer 43 in addition to the gallium nitride based semiconductor layers 25 and 27. The gallium nitride based semiconductor layer 43 is composed of, for example, a p-type gallium nitride semiconductor, and a p-type dopant to define the conductivity of this gallium nitride semiconductor may be, for example, magnesium. The p-type gallium nitride semiconductor is composed of, for example, GaN, AlGaN or InAlGaN. The gallium nitride based semiconductor layer 43 may be, for example, a p-type cladding layer.

The gallium nitride based semiconductor region 15 may include a gallium nitride based semiconductor layer 45. The gallium nitride based semiconductor layer 45 is composed of, for example, an n-type gallium nitride semiconductor, and an n-type dopant to define the conductivity of this gallium nitride semiconductor may be, for example, silicon. The n-type gallium nitride semiconductor is composed of, for example, GaN, AlGaN or InAlGaN. The gallium nitride based semiconductor layer 45 may be, for example, an n-type cladding layer.

The light emitting layer 37 is located between the gallium nitride based semiconductor layer (e.g., n-type cladding layer) 45 and the gallium nitride based semiconductor layer (e.g., p-type cladding layer) 43. The gallium nitride based semiconductor layer 45 and the gallium nitride based semiconductor layer 43 have refractive indices lower than those of the optical guide layers 39 and 41. The gallium nitride based semiconductor layer 45 and the gallium nitride based semiconductor layer 43 confine light into the light emitting layer 37.

The gallium nitride based semiconductor layer 25 has a band gap wider than that of the gallium nitride based semiconductor layer 43. The gallium nitride based semiconductor layer 25 forms a junction 45a with the gallium nitride based semiconductor layer 43. The gallium nitride based semiconductor layer 25 of an oxygen concentration higher than that of the light emitting layer 37 makes the junction surface 45a flat, which reduces the scattering loss at the interface 45a. The light emitting layer 37 also forms a junction 45c with the gallium nitride based semiconductor region 19.

The gallium nitride based semiconductor region 45 forms a junction 45b with the light emitting layer 37. The gallium nitride based semiconductor region 45 of an oxygen concentration higher than that of the light emitting layer 37 has excellent surface morphology, and makes the junction 45b flat. This reduces the scattering loss at the interface 45b.

In the group III nitride optical semiconductor device 11b, an insulating layer 47 for protection is provided on the gallium nitride based semiconductor layer 27. The insulating layer 47 has a stripe-shaped opening 47a. A first electrode (e.g., anode) 49a is provided on the insulating layer 47 and over the opening 47a. A second electrode (e.g., cathode) 49b is provided on the back surface 13b of the supporting base 13. Since the gallium nitride based semiconductor layer 27 is grown on the gallium nitride based semiconductor layer 43 with flat morphology, the gallium nitride based semiconductor layer 27 has satisfactory crystal quality, which provides excellent contact characteristics. The gallium nitride based semiconductor layer 43 forms a junction 45d with the gallium nitride based semiconductor layer 27. The junction surface 45d becomes flat.

In the group III nitride optical semiconductor device 11b, a tilt angle $A_{off}$ in a range of from 63 to 80 degrees or from 100 and 117 degrees with reference to the reference plane Sc can reduce the overflow of carriers.

The group III nitride optical semiconductor device 11b has a structure of, for example, a gain-guided laser diode. The group III nitride optical semiconductor device 11b may have a pair of end surfaces 50a and 50b. The end surfaces 50a and 50b are preferably formed as, for example, cleavage surfaces for optical cavity. The group III nitride optical semiconductor device 11b emits laser beam L from one of the end surfaces 50a and 50b.

Now, methods of fabricating an epitaxial substrate and a group III nitride optical semiconductor device are described below. FIGS. 4 to 7 illustrate the products in major steps of the methods.

An epitaxial structure for a light-emitting device was fabricated through an organic metal vapor-phase deposition process. The following sources were used: trimethylgallium (TMG); trimethylaluminium (TMA); trimethylindium (TMI); and ammonia ($NH_3$). The following dopant sources were used: silane ($SiH_4$); and bis(cyclopentadienyl)magnesium ($CP_2Mg$). In the description that follows, a hexagonal semipolar gallium nitride substrate may be used as the group III nitride semiconductor substrate having a primary surface with semi-polarity. Alternatively, a hexagonal nonpolar gallium nitride substrate may be used as the group III nitride semiconductor substrate having a primary surface with non-polarity. In the description below, oxygen acting as an n-type dopant is supplied from impurity contained in at least one of a group III source and a nitrogen source. The following description is made with reference to a hexagonal semipolar gallium nitride substrate.

Figure 4:
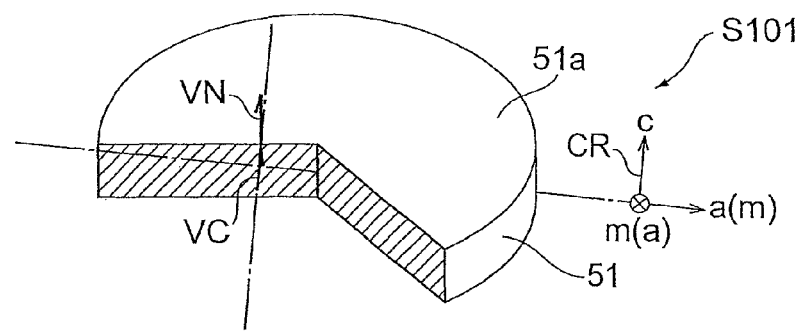
FIG. 4 is a view illustrating products in the primary steps of a method of the present embodiment.
Figure 4:
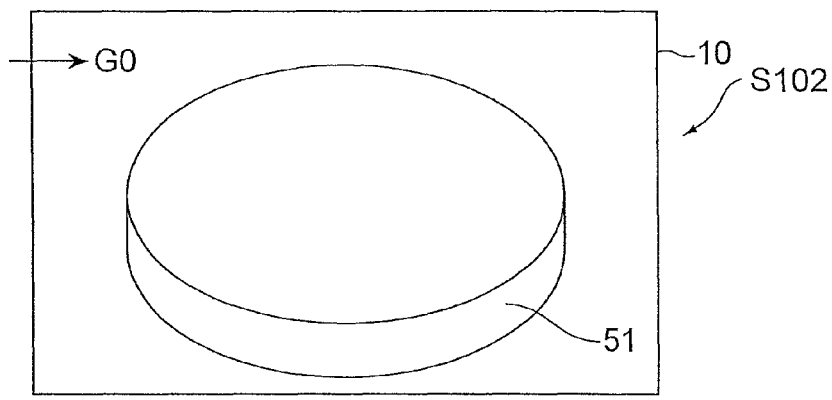
Figure 4:
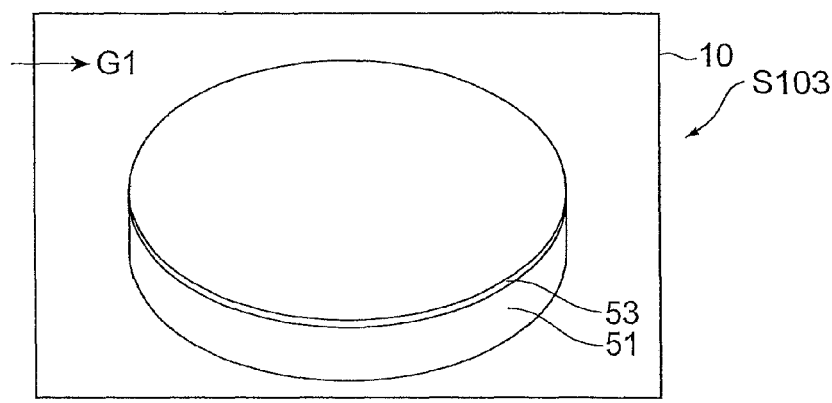

In Step S101, as shown in Part (a) of FIG. 4, a gallium nitride substrate was prepared. The gallium nitride substrate has a primary surface tilting in a direction from a c-plane toward an m-plane or an a-plane by an angle of from 10 to 80 degrees. The primary surface of the gallium nitride substrate has an area of, for example, 25 $mm^2$ or more, which corresponds to 5 sq. mm, for example. The gallium nitride substrate 51 preferably has a primary surface 51a of, for example, two inches or more in size. The GaN substrate 51 is loaded to a growth reactor 10, and then is subjected to thermal cleaning in the reactor 10 in Step S102 as shown in Part (b) of FIG. 4. Heat treatment is performed for 10 minutes at a temperature of 1050° C. while a gas G0 containing $NH_3$ and $H_2$ flows into the reactor 10.

In Step S103, as shown in Part (b) of FIG. 4, a source gas G1 containing a group III source and a nitrogen source is supplied to the reactor 10 for epitaxially growing an n-type gallium nitride based semiconductor region 53 on the primary surface 51a of the GaN substrate 51. The source gas G1 contains TMG, TMA, $NH_3$ and $SiH_4$, for example. A Si-doped AlGaN cladding layer is grown as the gallium nitride based semiconductor region 53 at a temperature of, for example, 1050° C. The AlGaN layer has a thickness of 2 μm for example. The gallium nitride based semiconductor region 53 has an oxygen concentration of from $5 \times 10^{16}$ $cm^{-3}$ to $5 \times 10^{18}$ $cm^{-3}$, for example. This method can suppress the formation of a certain facet, which is inappropriate to semipolarity, in the growth of a oxygen-contained gallium nitride based semiconductor on the semipolar surface. This makes the surface morphology flat. In the subsequent growth, the oxygen incorporation suppresses the formation of the certain facet. The gallium nitride based semiconductor region 53 of a concentration of carbon of $5 \times 10^{18}$ $cm^{-3}$ or less prevents the formation of the facet in this gallium nitride based semiconductor. The gallium nitride based semiconductor region 53 of an oxygen concentration of, for example, $1 \times 10^{17}$ $cm^{-3}$ or more has flatter surface morphology, and further suppresses the formation of the facet.

Figure 5:
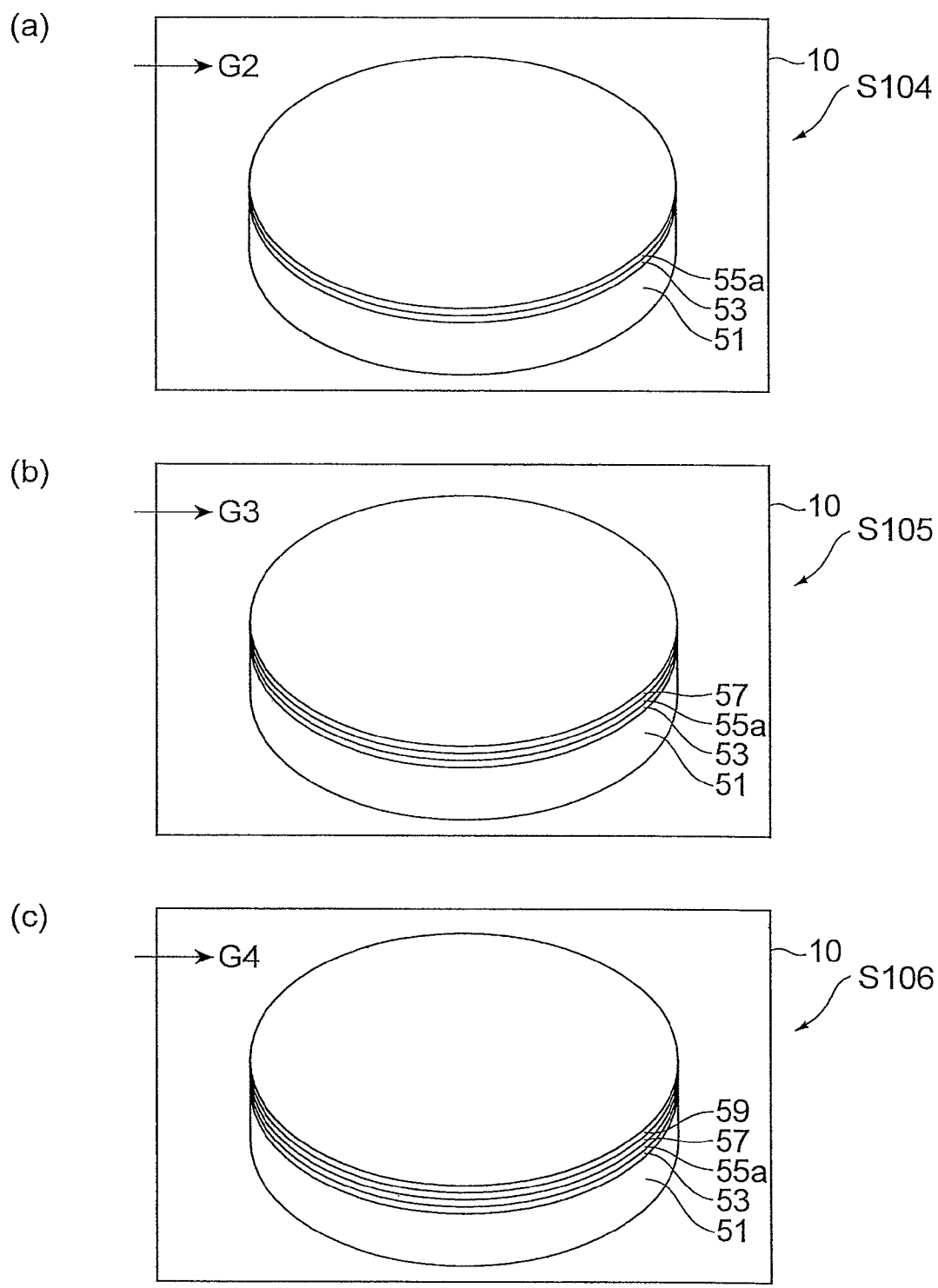
FIG. 5 is a view illustrating products in the primary steps of a method of the present embodiment.
Figure 6:
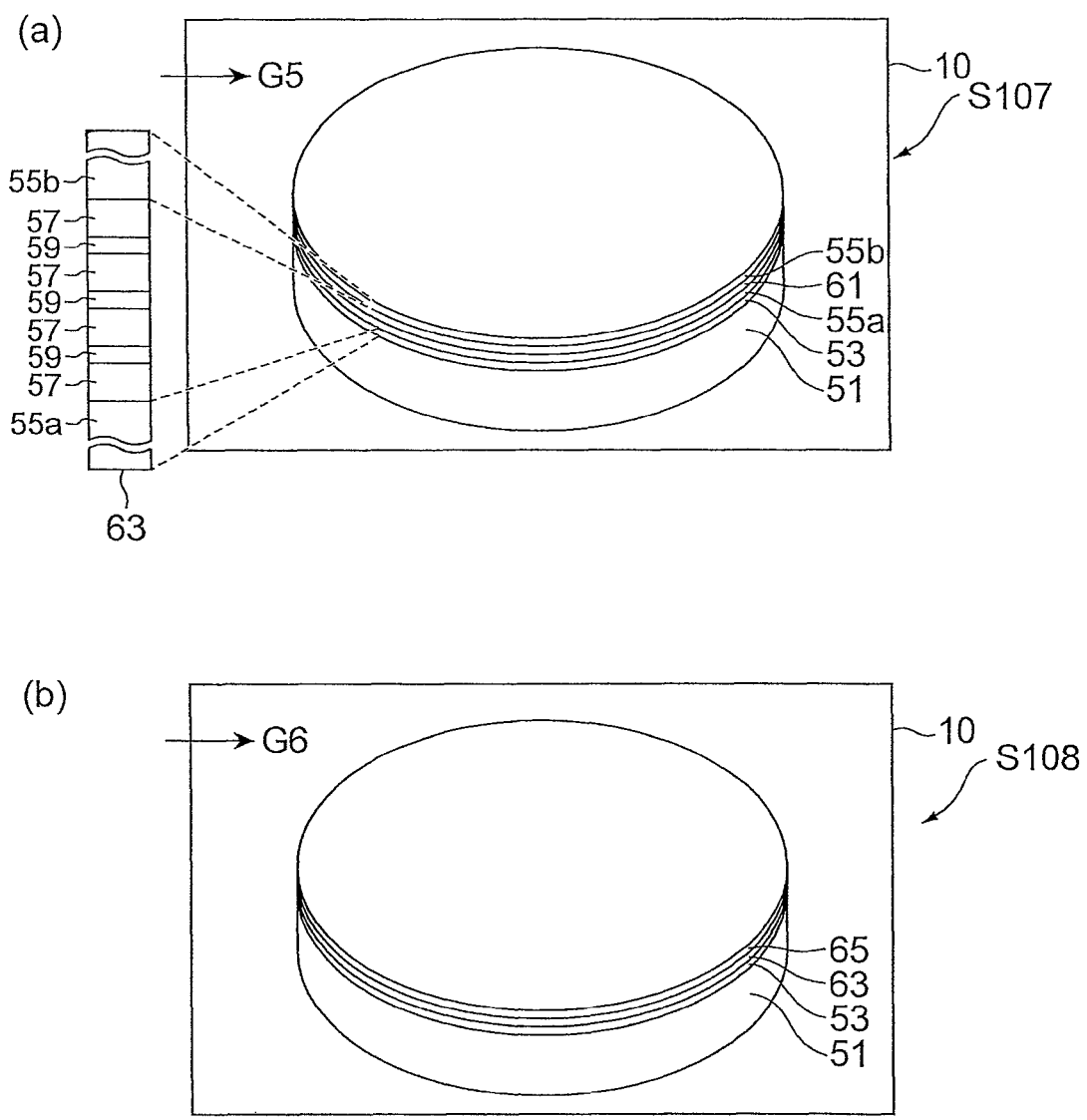
FIG. 6 is a view illustrating products in the primary steps of a method of the present embodiment.

After the substrate temperature is decreased to 840° C., in Step S104, as shown in Part (a) of FIG. 5, a source gas G2 containing a group III source and a nitrogen source is supplied to the reactor 10 to epitaxially grow an undoped InGaN optical guide layer 55a. The source gas G2 contains, for example, TMG, TMI and $NH_3$. The resulting InGaN optical guide layer 55a has an oxygen concentration of $5 \times 10^{16}$ $cm^{-3}$ to $5 \times 10^{18}$ $cm^{-3}$ for example. The thickness of the InGaN optical guide layer 55a is 100 nm. The oxygen concentration of the InGaN optical guide layer 55a is preferably $1 \times 10^{17}$ $cm^{-3}$ or more for example.

Then, an active layer having a quantum well structure is formed. The active layer has an average oxygen concentration of $5 \times 10^{16}$ $cm^{-3}$ or more, and the active layer has an average oxygen concentration of $5 \times 10^{18}$ $cm^{-3}$ or less. The average oxygen concentration may be $1 \times 10^{17}$ $cm^{-3}$ or more. In Step S105, as shown in Part (b) of FIG. 5, a source gas G3 containing a group III source and a nitrogen source is supplied to the reactor 10 to grow a GaN barrier layer 57 on the InGaN optical guide layer 55a at a substrate temperature of 840° C. The source gas G2 contains, for example, TMG and $NH_3$. The thickness of the GaN layer 57 is, for example, 15 nm.

After the substrate temperature is lowered to 790° C., in Step S106, as shown in Part (c) of FIG. 5, a source gas G4 containing a group III source and a nitrogen source is supplied to the reactor 10 to epitaxially grow an undoped InGaN well layer 59 on the GaN barrier layer 57. The source gas G4 contains, for example, TMG, TMI and $NH_3$. The oxygen concentration of the InGaN well layer 59 is preferably $6 \times 10^{17}$ $cm^{-3}$ or less for example. The thickness of the well layer 59 is, for example, 3 nm.

Thereafter, after the substrate temperature is increased to 840° C., the GaN barrier layer 57 of a thickness of 15 nm is grown thereon. The growth of the barrier layer 57 and the well layer 59 can be repeated, if necessary. In Step S107, as in the case for the optical guide layer 55a, a source gas G5 containing a group III raw material and a nitrogen raw material is supplied to the growth reactor 10 at a substrate temperature of 840° C. to epitaxially grow an undoped InGaN optical guide layer 55b, and an active layer 61 and a light emitting layer 63 are fabricated as shown in Part (a) of FIG. 6. The light emitting layer 63 of a concentration of carbon of $5\times10^{18}$ cm$^{-3}$ or less prevents the formation of the facet in its gallium nitride semiconductor.

Then, a group III source and a nitrogen source are supplied to the reactor to form a second conductive type gallium nitride based semiconductor region on the light emitting layer 63. For this formation, in Step S108, after the substrate temperature is increased to 1000° C., a source gas G6 containing a group III source and a nitrogen source is introduced to the reactor 10 to epitaxially grow an electron block layer 65 on the light emitting layer 63 as shown in Part (b) of FIG. 6. The source gas G6 contains, for example, TMG, TMA, NH$_3$ and CP$_2$Mg. The thickness of the electron block layer 65 may be 20 nm, for example.

Figure 7:
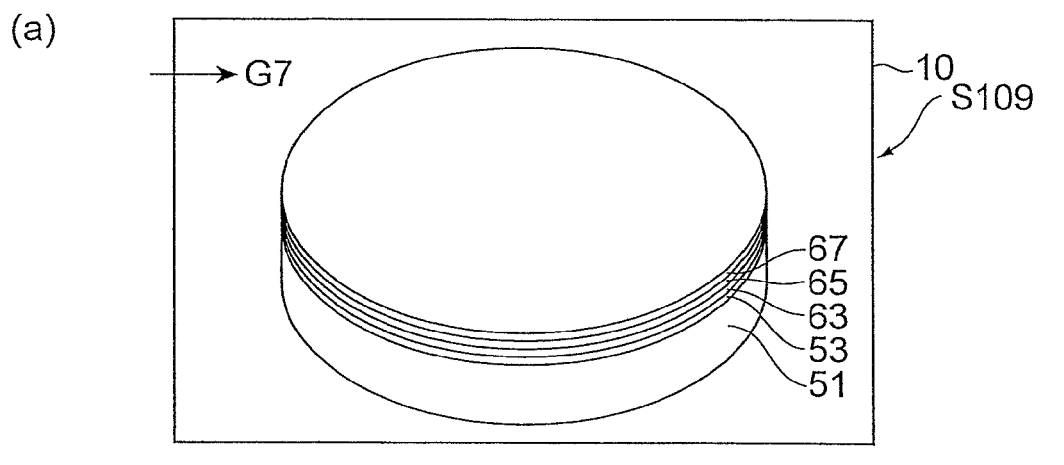
FIG. 7 is a view illustrating products in the primary steps of a method of the present embodiment.
Figure 7:
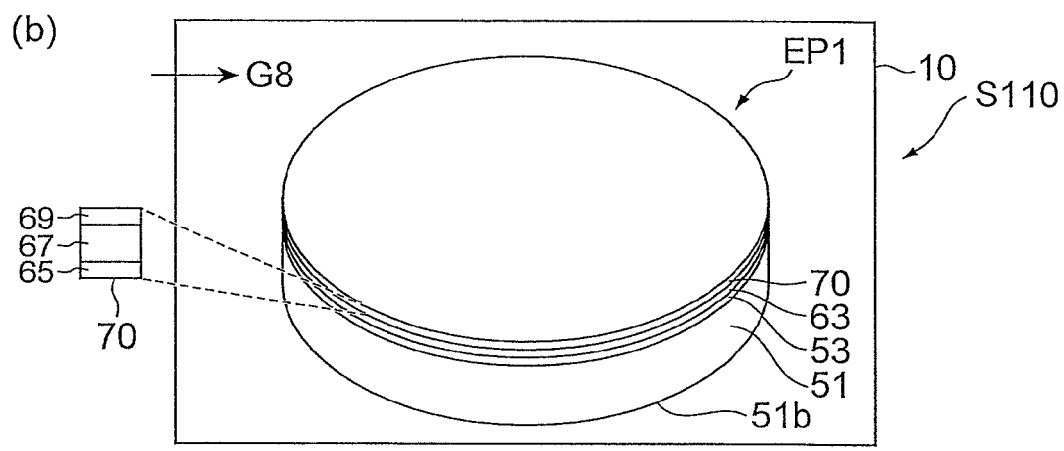

In Step S109, a source gas G7 containing a group III source and a nitrogen source is introduced to the reactor 10 to epitaxially grow a p-type cladding layer 67 on the electron block layer 65 as shown in Part (a) of FIG. 7. The source gas G7 contains, for example, TMG, TMA, NH$_3$ and CP$_2$Mg. The thickness of the p-type cladding layer 67 may be, for example, 400 nm.

In Step S110, a source gas G8 containing a group III source and a nitrogen source is introduced to the reactor 10 to epitaxially grow a p-type contact layer 69 on the p-type cladding layer 67 as shown in Part (b) of FIG. 7. The source gas G8 contains, for example, TMG, NH$_3$ and CP$_2$Mg. The thickness of the p-type contact layer 69 may be, for example, 50 nm.

The gallium nitride based semiconductor layers 65, 67 and 69 each have an oxygen concentration of $5\times10^{16}$ cm$^{-3}$ or more, and the gallium nitride based semiconductor layers 65, 67 and 69 each have an oxygen concentration of $5\times10^{18}$ cm$^{-3}$ or less. The oxygen concentration may be $1\times10^{17}$ cm$^{-3}$ or more. The gallium nitride based semiconductor layers 65, 67 and 69 each preferably have an oxygen concentration higher than that of the light emitting layer 63. A gallium nitride based semiconductor region 70 having a concentration of carbon of $5\times10^{18}$ cm$^{-3}$ or less prevents the formation of the facet in its gallium nitride semiconductor.

Now, the doping of oxygen and the morphology of the light emitting layer and n-type gallium nitride based semiconductor layer will be described below. An InGaN well layer is grown at a low temperature, and this low temperature growth suppresses the migration of the atoms. Thus, the resulting growth tends to form island-shaped depositions. Gallium nitride semiconductor, such as n-type GaN and AlGaN, is grown at a high temperature, which promotes step-flow growth. Growth mode in which the oxygen doping formes a flat surface morphology is different from the above growth modes, such as island growth and step flow growth. The oxygen doping stabilizes the formation of semipolar surfaces. For example, in gallium nitride crystal growth, it is thought that c-plane is stable and is likely formed as a facet in the growth of gallium nitride crystal onto a semipolar surface. This formation of c-plane, however, adversely affects surface morphology in epitaxial growth onto the semipolar surface. Oxygen doping can suppress the formation of facets that adversely affect the morphology in the epitaxial growth onto the semipolar surface.

The substrate temperature is decreased to a room temperature and a resulting epitaxial substrate EP1 is removed out of the growth reactor. The epitaxial substrate EP1 includes the group III nitride semiconductor substrate 51, the first conductive type gallium nitride based semiconductor region 53, the light emitting layer 63, and the second conductive type gallium nitride based semiconductor region 70. In the epitaxial substrate EP1, the gallium nitride based semiconductor regions 53 and 70 of an oxygen concentration of $5\times10^{16}$ cm$^{-3}$ or more make their surface morphology flat. Thus, the surfaces of the gallium nitride based semiconductor regions 53 and 70 do not include any c-plane and exhibit semipolar. Thus, the gallium nitride based semiconductor regions 53 and 70 of oxygen concentration of $1\times10^{17}$ cm$^{-3}$ or more enhances the effect of the above technical contribution. The gallium nitride based semiconductor regions 53 and 70 of oxygen concentration exceeding $5\times10^{18}$ cm$^{-3}$ have crystal quality which is not excellent. The light emitting layer 63 can be grown on the gallium nitride based semiconductor region 53 of satisfactory surface morphology.

An anode electrode is formed on the p-type gallium nitride based semiconductor region 70 of the epitaxial substrate EP1 for electrical connection with the p-type contact layer 69. The back surface 51b of the substrate 51 is polished as needed, and then a cathode electrode is formed on the polished back surface. These electrodes may be formed by, for example, evaporation.

When the n-type gallium nitride based semiconductor region 53 has an oxygen concentration higher than oxygen concentrations of the light emitting layer 63 and the p-type gallium nitride based semiconductor region 70, the semiconductor region 53 has the large contribution to an improvement in the surface morphology because the semiconductor region 53 has the largest thickness among the epitaxial layers of the light-emitting device. This incorporation of oxygen that is an n-type dopant does not cause any carrier compensation therein. When the light emitting layer 63 has a low concentration of oxygen, its luminance efficiency is improved. When the p-type gallium nitride based semiconductor region 70 has a low concentration of oxygen, this incorporation of oxygen, which acts as an n-type dopant, has little effect of carrier compensation.

When the light emitting layer 63 has an oxygen concentration higher than that of the p-type gallium nitride based semiconductor region 70, the light emitting layer 63 has improved morphology, which contributes to an improvement in the crystal quality of the p-type gallium nitride based semiconductor region 70. The p-type gallium nitride based semiconductor region 70 of a lower oxygen concentration has a larger carrier concentration.

When the p-type gallium nitride based semiconductor region 70 has an oxygen concentration lower than that of the light emitting layer 63, the surface of the p-type gallium nitride based semiconductor region 70 has flatness that is easily impaired by doping with magnesium (Mg), and this flatness of the semiconductor region 70 can be, however, improved by oxygen doping. The light emitting layer 63 of a low oxygen concentration has excellent luminance efficiency. When the p-type gallium nitride based semiconductor region 70 is grown at a low temperature to have an increased oxygen concentration, the thermal stress to the light emitting layer 63 is reduced.

When the p-type gallium nitride based semiconductor region 70 has an oxygen concentration higher than that of the n-type gallium nitride based semiconductor region 53, the flatness of the semiconductor region 70 can be improved by doping with oxygen. When the p-type gallium nitride based semiconductor region 70 has a high content of aluminum for increasing the oxygen concentration, the laser diode has an improved property in optical confinement. When the p-type gallium nitride based semiconductor region 70 is grown at a lower temperature for increasing its oxygen concentration, the thermal stress onto the light emitting layer 63 is reduced.

Example 1

Figure 8:
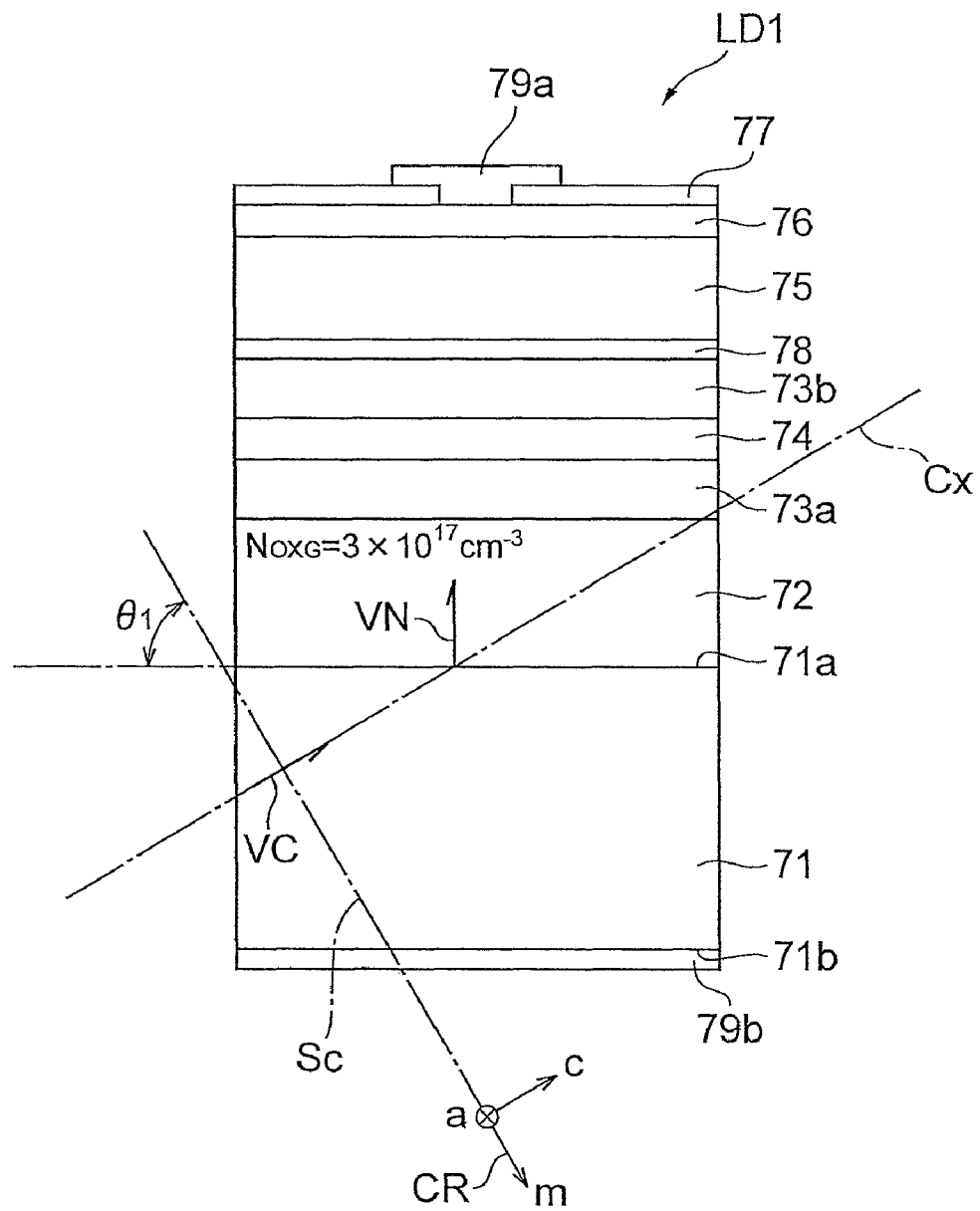
FIG. 8 is a view illustrating a semiconductor laser LD1 of Example 1.

Laser diode LD1 was fabricated. A GaN substrate 71 was prepared, and the substrate 71 has a semipolar primary surface that is tilted toward an m-axis by an angle $\theta_1$ of 75 degrees. The semipolar primary surface corresponded to (20-21) surface. After the GaN substrate 71 was placed in a growth reactor, ammonia ($NH_3$) and hydrogen ($H_2$) were supplied to the reactor to keep the temperature of the GaN substrate 71 at 1050° C. for ten minutes. After the pretreatment (thermal cleaning), a source gas was supplied to the growth reactor to form a laser structure as follows. First, an n-type $Al_{0.04}Ga_{0.96}N$ cladding layer 72 was grown at a temperature of 1050° C. The substrate temperature was decreased to 840° C. to grow an $In_{0.03}Ga_{0.97}N$ optical guide layer 73a. On the $In_{0.03}Ga_{0.97}N$ optical guide layer 73a, a quantum well active layer 74 was grown. At a substrate temperature of 840° C., an $In_{0.03}Ga_{0.97}N$ optical guide layer 73b was grown on the active layer 74. After the substrate temperature was increased to 1000° C., an $Al_{0.12}Ga_{0.88}N$ electron block layer 78, a p-type $Al_{0.06}Ga_{0.94}N$ cladding layer 75, and a p-type GaN contact layer 76 were grown thereon. The resulting laser structure had a photoluminescence wavelength of 450 nm. In the laser structure, the cladding layer, which is in direct contact with the GaN substrate 71 and has a large thickness, contributes most to the surface morphology. In Example 1, the cladding layer 72 had an oxygen concentration of $3 \times 10^{17}$ $cm^{-3}$. An anode is formed on the contact layer 76 over the opening of the insulating layer 77 and a cathode is formed on the back surface 71b of the GaN substrate 71, to fabricate the semiconductor laser LD1 shown in FIG. 8.

Figure 9:
FIG. 9 is a view showing differential interference contrast microscope images of the surface morphology of p-type contact layers included in semiconductor lasers LD1 and LDC1, respectively.
Figure 9:
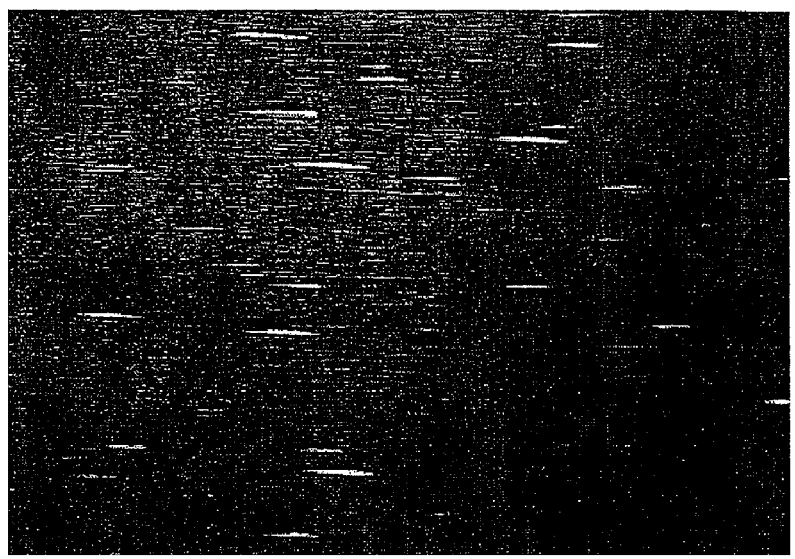

An n-type $Al_{0.04}Ga_{0.96}N$ cladding layer was grown at a temperature of 1150° C. to fabricate a semiconductor laser LD0. The cladding layer had an oxygen concentration of $9 \times 10^{16}$ $cm^{-3}$. Part (a) of FIG. 9 illustrates the surface morphology of a p-type GaN contact layer in the laser structure of the semiconductor laser LD1. Part (b) of FIG. 9 illustrates the surface morphology of a p-type GaN contact layer in the laser structure of the semiconductor laser LD0. The p-type contact layer in the laser structure of the semiconductor laser LD0 exhibited satisfactory surface morphology. This suggests that the semipolar surface was stabilized in the semiconductor laser LD1 with the n-type AlGaN cladding layer having a higher oxygen concentration. The comparison between the laser structures revealed that the laser structure of the semiconductor laser LD1 had flatter morphology.

Example 2

Another laser diode was fabricated. A GaN substrate 81 was prepared, and the substrate 81 has a semipolar primary surface tilting toward an m-axis by an angle $\theta_2$ of 75 degrees. The semipolar primary surface corresponded to the (20-21) surface. After the GaN substrate 81 was loaded in a growth reactor, ammonia ($NH_3$) and hydrogen ($H_2$) were supplied to the growth reactor and the temperature of the GaN substrate 81 was kept at 1050° C. for ten minutes. After the thermal cleaning, a source gas was supplied to the growth reactor to form a laser structure as follows. First, an n-type $Al_{0.04}Ga_{0.96}N$ cladding layer 82 was grown at a temperature of 1050° C. The substrate temperature was decreased to 840° C. to grow an $In_{0.02}Ga_{0.98}N$ optical guide layer 83a of a thickness of 100 nm thereon. On the optical guide layer 83a, a quantum well active layer 84 was formed. At a substrate temperature of 840° C., an $In_{0.02}Ga_{0.98}N$ optical guide layer 83b was grown on the active layer 84. The substrate temperature was increased to 1000° C., and then an $Al_{0.12}Ga_{0.88}N$ electron block layer 85, a p-type $Al_{0.06}Ga_{0.94}N$ cladding layer 86 and a p-type GaN contact layer 87 were grown thereon. The photoluminescence wavelength of the resulting laser structure falls within 405 nm band.

Figure 10:
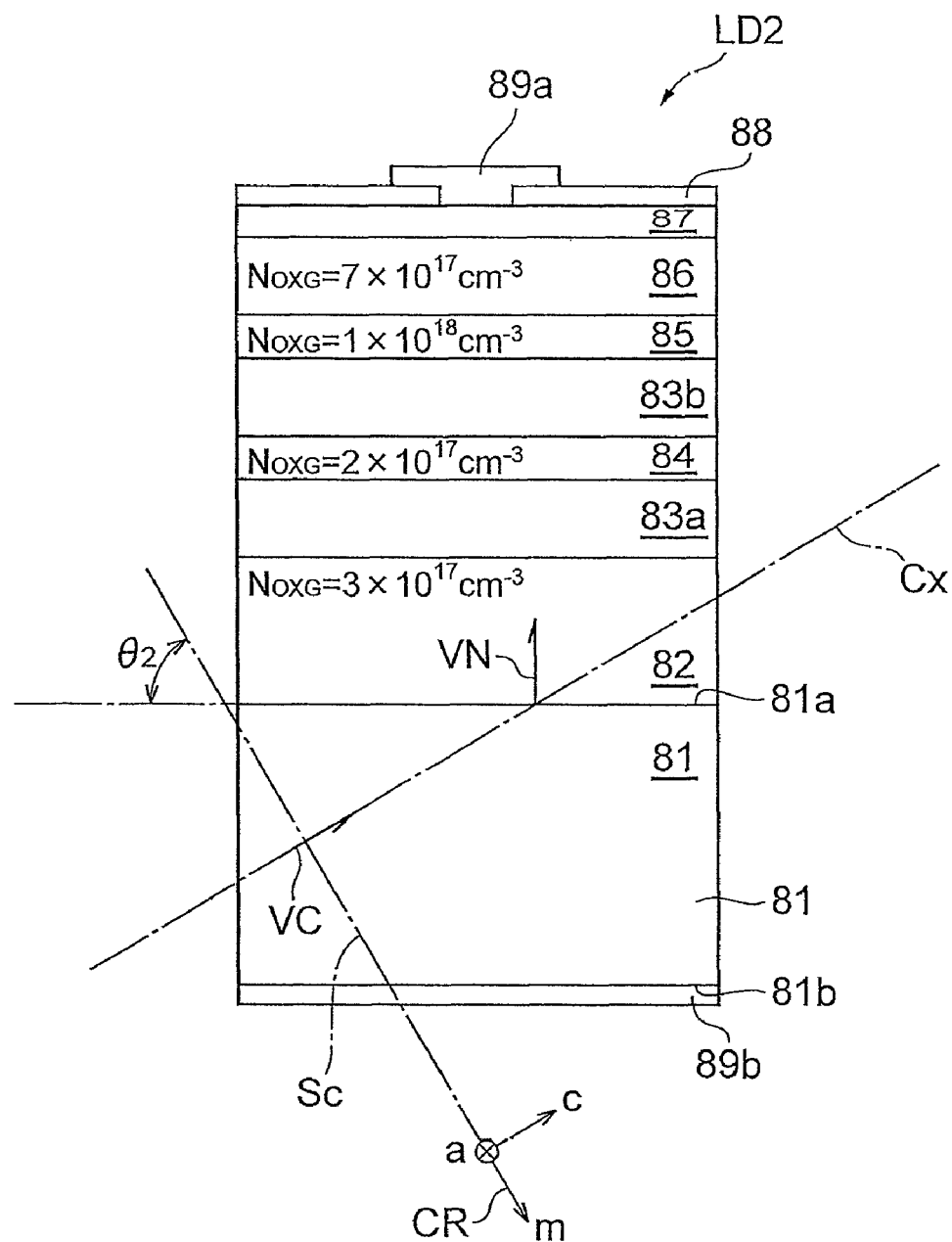
FIG. 10 is a view illustrating a semiconductor laser LD2 of Example 2.

An anode 89a is formed on the contact layer 87 and over the stripe-shaped opening (e.g., 10 μm in width) of the insulating layer (e.g., $SiO_2$) 88, and a cathode 89b is formed on the back surface 81b of the GaN substrate 81. Then, a-plane cleavage was performed at an interval of 800 μm to fabricate a gain-guided semiconductor laser LD2 shown in FIG. 10.

In this example, the n-type cladding layer had an oxygen concentration of $3 \times 10^{17}$ $cm^{-3}$. The quantum well active layer 84 had an oxygen concentration of $2 \times 10^{17}$ $cm^{-3}$. The p-type electron block layer 85 had an oxygen concentration of $1 \times 10^{18}$ $cm^{-3}$. The p-type cladding layer 86 had an oxygen concentration of $7 \times 10^{17}$ $cm^{-3}$. In this structure, the oxygen concentration of the p-type layers is higher than that of the light emitting layer.

For comparison, an LD structure was fabricated on a c-plane GaN substrate under the same conditions for film formation. In the resulting structure formed on the c-plane under the same conditions for film formation, GaN semiconductor had a different amount of oxygen incorporated therein, and all of the epitaxial layers had an oxygen concentration of $1 \times 10^{17}$ $cm^{-3}$ or less. Then, m-plane cleavage is performed to fabricate a gain-guided semiconductor laser LDC2 having mirrors for optical cavity.

Figure 11:
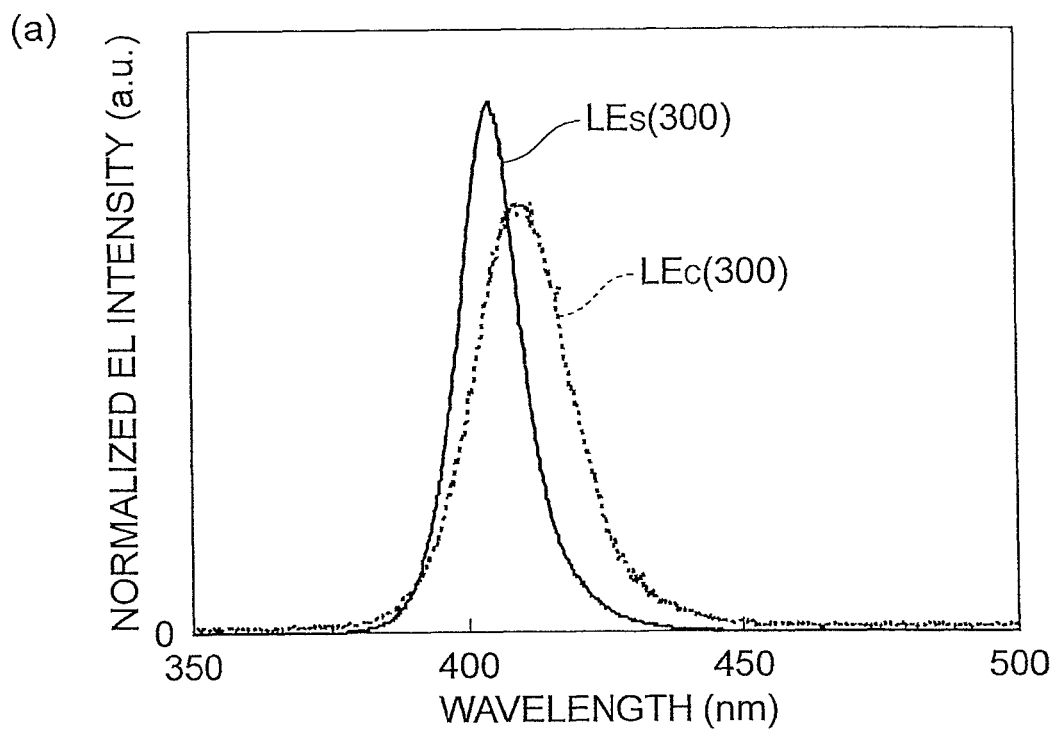
FIG. 11 is a view showing graphs of EL spectra measured at an absolute temperature of 300K and an absolute temperature of 10K, respectively.
Figure 11:
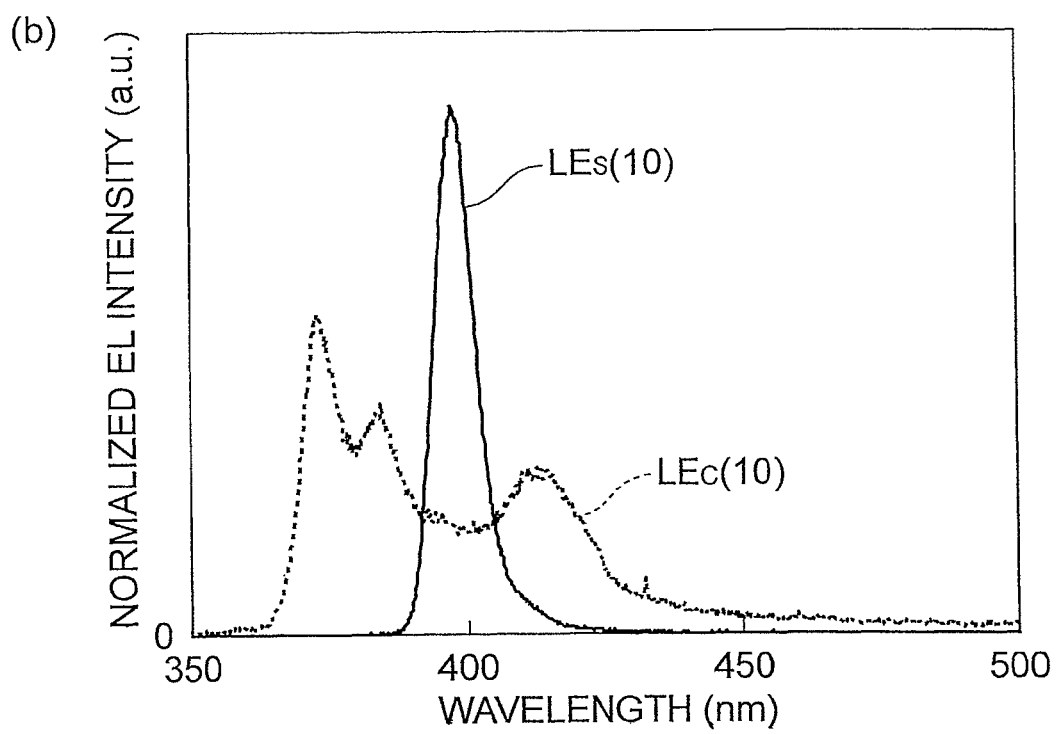

A current of 2 mA was applied to these semiconductor lasers LD2 and LDC2 to measure electroluminescence (EL) at an absolute temperature of 300 Kelvin (300K) and an absolute temperature of 10 Kelvin (10K). Part (a) of FIG. 11 illustrates the EL spectra measured at an absolute temperature of 300 Kelvin, whereas Part (b) of FIG. 11 illustrates the EL spectra measured at an absolute temperature of 10 Kelvin. $EL_S(300)$ and $EL_S(10)$ show EL spectra of the semiconductor laser LD2 of Example 2 measured as above, whereas $EL_C(300)$ and $EL_C(10)$ shows EL spectra of the semiconductor laser LDC2 of Comparative Example measured as above. The EL spectra at temperatures 300K and 10K were compared with each other. At a temperature of 300K, both of the EL spectra $EL_S(300)$ and $EL_C(300)$ of the semiconductor lasers LD2 and LDC2 had peaks around the wavelength of 405 nm from MQW. At a temperature of 10K, the EL spectra of the semiconductor laser LD2 of Example 2 had a single peak, whereas the semiconductor laser LDC2 of Comparative Example had a number of peaks from both MQW and donor-acceptor pair (DAP) emission in the p-type semiconductor layers. This indicates that overflow of electrons into the p-type semiconductor layers was caused in Comparative Example at a low temperature at which the depletion of holes is caused.

In the semiconductor laser LD2 of Example 2, the p-type semiconductor layers were doped with oxygen, which acts as a donor, at a higher concentration than that of the light emitting layer, and yet had satisfactory carrier injection efficiency. The flatness of the p-type semiconductor layers is easily impaired by doping with Mg. The incorporation of an appropriate amount of oxygen, however, permits the achievement of excellent surface flatness and excellent carrier injection efficiency. The improved flatness of the p-type semiconductor layers and the improved abruptness of the interface between the electron block layer and the cladding layer lead to a reduction in scattering loss of light in the optical cavity of the semiconductor laser.

Example 3

Figure 12:
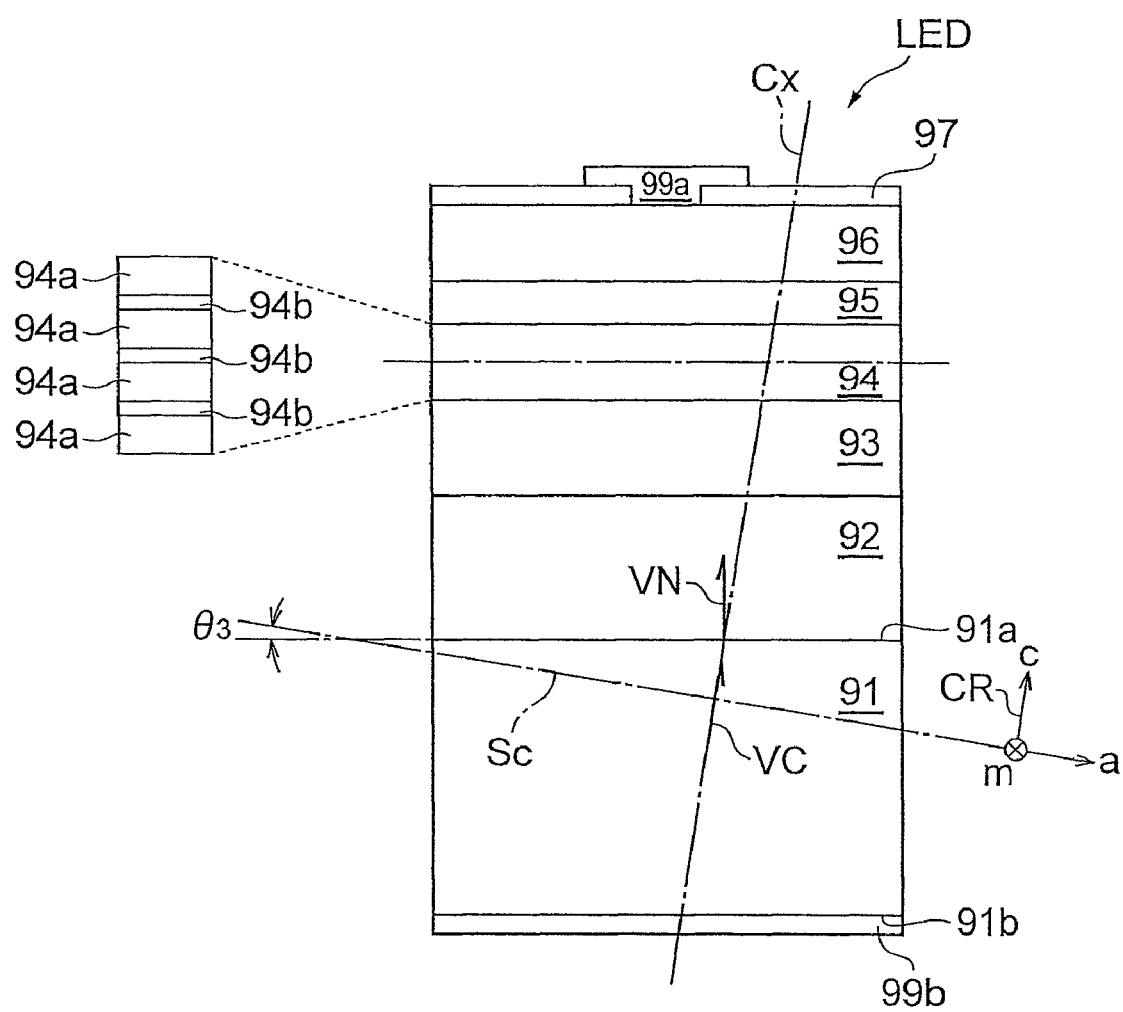
FIG. 12 is a view illustrating a light emitting diode of Example 3.

A light emitting diode was fabricated. A GaN substrate 91 was prepared, and the substrate 91 has a semipolar primary surface tilting toward an a-axis by an angle $\theta_3$ of 18 degrees. The GaN substrate 91 was loaded in a growth reactor, and then ammonia ($NH_3$) and hydrogen ($H_2$) were supplied to the reactor to keep the temperature of the GaN substrate 91 at a temperature of 1050° C. for ten minutes. After the thermal cleaning, a source gas was supplied to the growth reactor to fabricate a light emitting diode as follows. First, an n-type GaN layer 92 was grown to a thickness of 2 μm at a temperature of 1050° C. After the substrate temperature was decreased to a temperature of 840° C., an $In_{0.04}Ga_{0.96}N$ buffer layer 93 of a thickness of 100 nm is grown thereon. On the buffer layer 93, a quantum well active layer 94 was grown. Specifically, a GaN barrier layer 94a of a thickness of 15 nm was grown at a substrate temperature of 840° C., and an InAlGaN well layer 94b of a thickness of 3 nm was grown at a substrate temperature of 700° C. to form the active layer 94. The substrate temperature was increased to 1000° C., and then a p-type $Al_{0.18}Ga_{0.82}N$ electron block layer 95 of 20 nm in thickness, a p-type GaN contact layer 96 of 50 nm in thickness were grown on the active layer 94. On the contact layer 96, an anode (Ni/Au) 97 and a pad electrode 99a were formed, and on the back surface 91b of the substrate 91, a cathode (Ti/Al) was formed, thereby fabricating the light emitting diode LED1 shown in FIG. 12. Another light emitting diode structure with an InAlGaN well layer containing a different content of indium was fabricated. The relationship between oxygen concentration and optical output of well layers were examined in the following LED structure.

| LED: | In-Content, | Al-Content, | Oxygen Concentration ($cm^{-3}$), | Optical Output |
|---|---|---|---|---|
| LED1: | 0.18, | 0, | $2 \times 10^{17}$, | 1; |
| LED2: | 0.19, | 0.03, | $4 \times 10^{17}$, | 0.85; |
| LED3: | 0.20, | 0.06, | $1 \times 10^{18}$, | 0.54. |

The In content of the well layer was modified to obtain a desired emission wavelength around 450 nm. As the oxygen concentration of the well layer increased, the optical output decreased. This may indicate that the oxygen doping impairs the crystal quality of the well layer. The oxygen concentration in the well layer was controlled taking advantage of characteristics of aluminum that can easily adsorb oxygen but hardly release oxygen once incorporated at a low temperature (a temperature at which indium can be incorporated into the well layer).

Example 4

Figure 13:
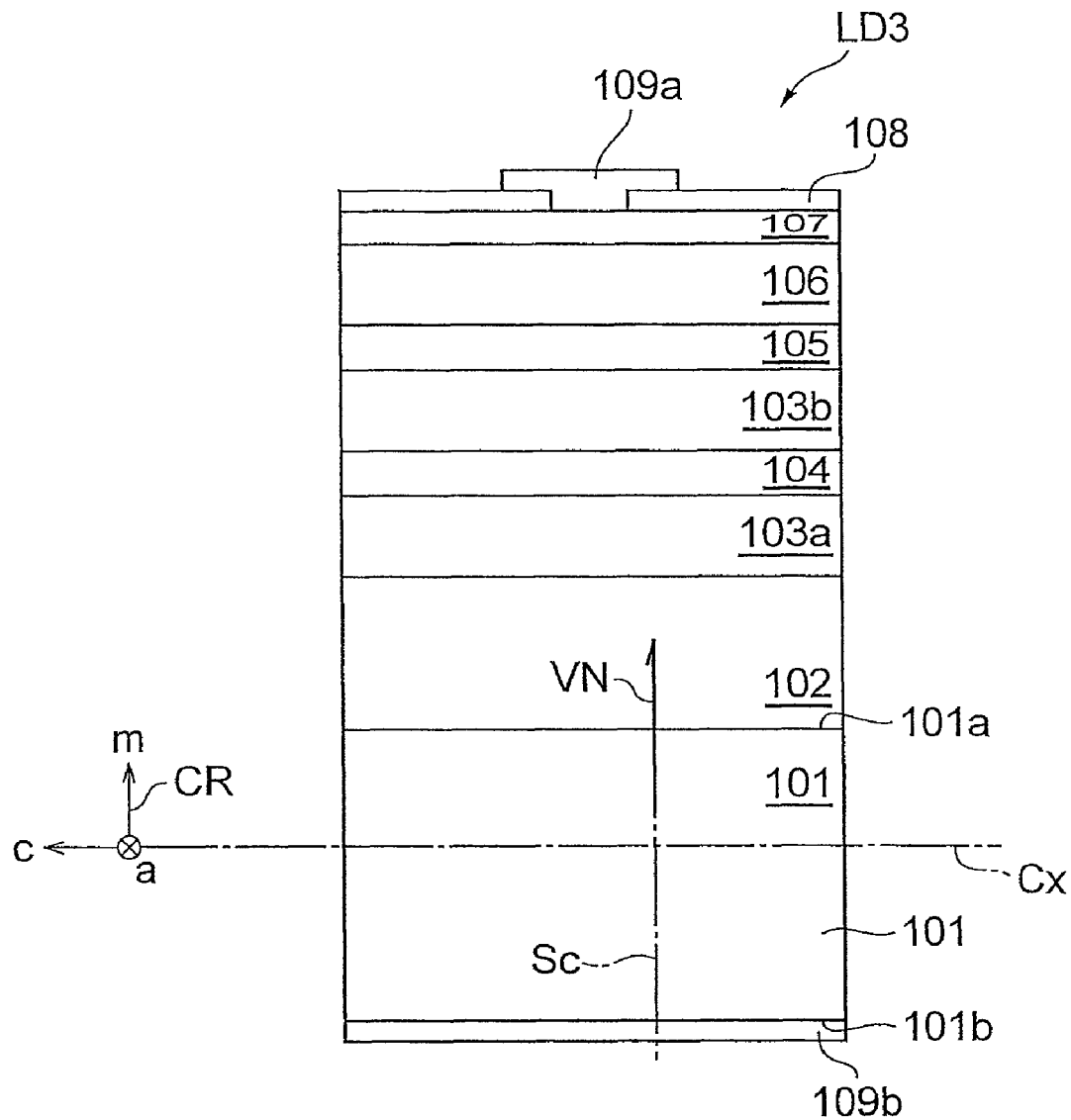
FIG. 13 is a view illustrating a structure of a laser diode of Example 4.

A GaN substrate having an m-plane primary surface was prepared. A laser diode LD3 was fabricated on the GaN substrate. FIG. 13 illustrates the laser diode structure of Example 4. The GaN substrate 101 was loaded in a growth reactor, and ammonia ($NH_3$) and hydrogen ($H_2$) were supplied to the reactor to perform a thermal cleaning of the GaN substrate 101 at a temperature of 1050° C. After the thermal cleaning, as in Example 1, a laser structure was fabricated on a nonpolar primary surface 101a of the GaN substrate 101 as follows:

$Al_{0.04}Ga_{0.96}N$ cladding layer 102: n-type, 2 μm, $In_{0.03}Ga_{0.97}N$ optical guide layer 103a: undoped, 100 nm, active layer 104: $In_{0.18}Ga_{0.82}N$ well layer (thickness: 3 nm)/GaN barrier layer (thickness: 15 nm), $In_{0.03}Ga_{0.97}N$ optical guide layer 103b: undoped, 100 nm, $Al_{0.12}Ga_{0.88}N$ electron block layer 105: p-type, 20 nm, $Al_{0.06}Ga_{0.94}N$ cladding layer 106: p-type, 400 nm, GaN contact layer 107: p-type, 50 nm.

An anode 109a was formed on a contact layer 107, an insulation film (e.g., $SiO_2$) 108 having a stripe-shaped opening (10 μm in width), and a cathode 109b was formed on a back surface 101b of the GaN substrate 101. Then, a gain-guided semiconductor laser LD3 was fabricated with cleavage.

Figure 14:
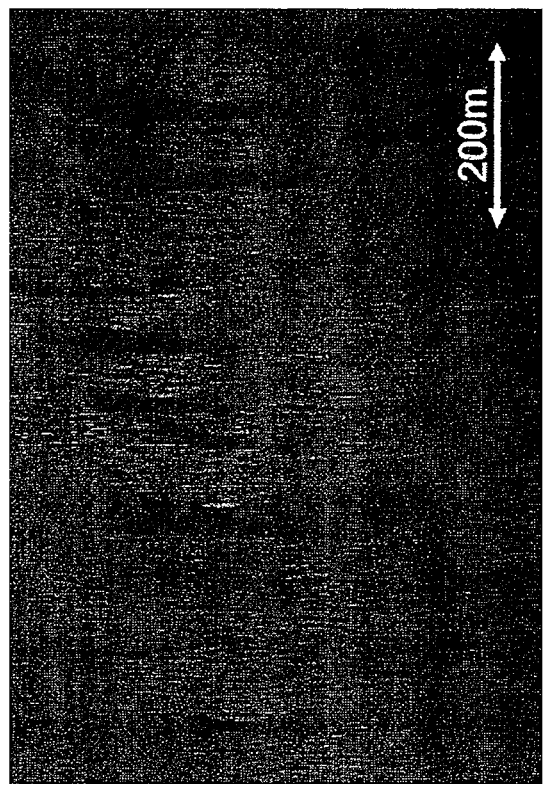
FIG. 14 is view illustrating the surface morphology of p-type contact layers of Example 4 and Comparative Example.
Figure 14:
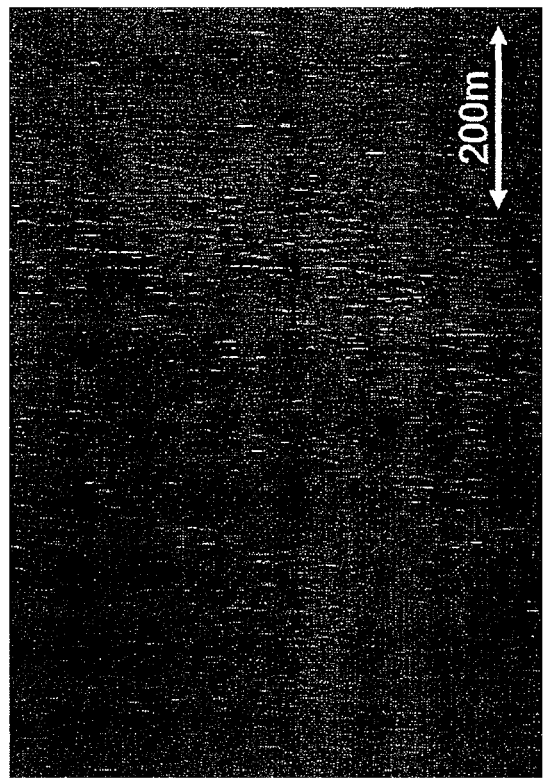

The measurement of the laser structure showed that the n-type $Al_{0.04}Ga_{0.96}N$ cladding layer 102 had an oxygen concentration of $1 \times 10^{17}$ $cm^{-3}$. This value is larger than the value of $2 \times 10^{16}$ $cm^{-3}$ for the LD structure for comparison. FIG. 14 shows images illustrating the surface morphology of the p-type contact layer 107 of Example 4 and the p-type contact layer of Comparative Example, respectively. The comparison between surfaces of the p-type contact layers shown in Parts (a) and (b) of FIG. 14 shows that the epitaxial layer of Example 4 had relatively flatter morphology. The surface of the epitaxial layer of Comparative Example had plural facets extending to the direction orthogonal to the c-axis. Example 4 indicates that a nonpolar surface can be also stabilized by oxygen.

Example 5

Figure 15:
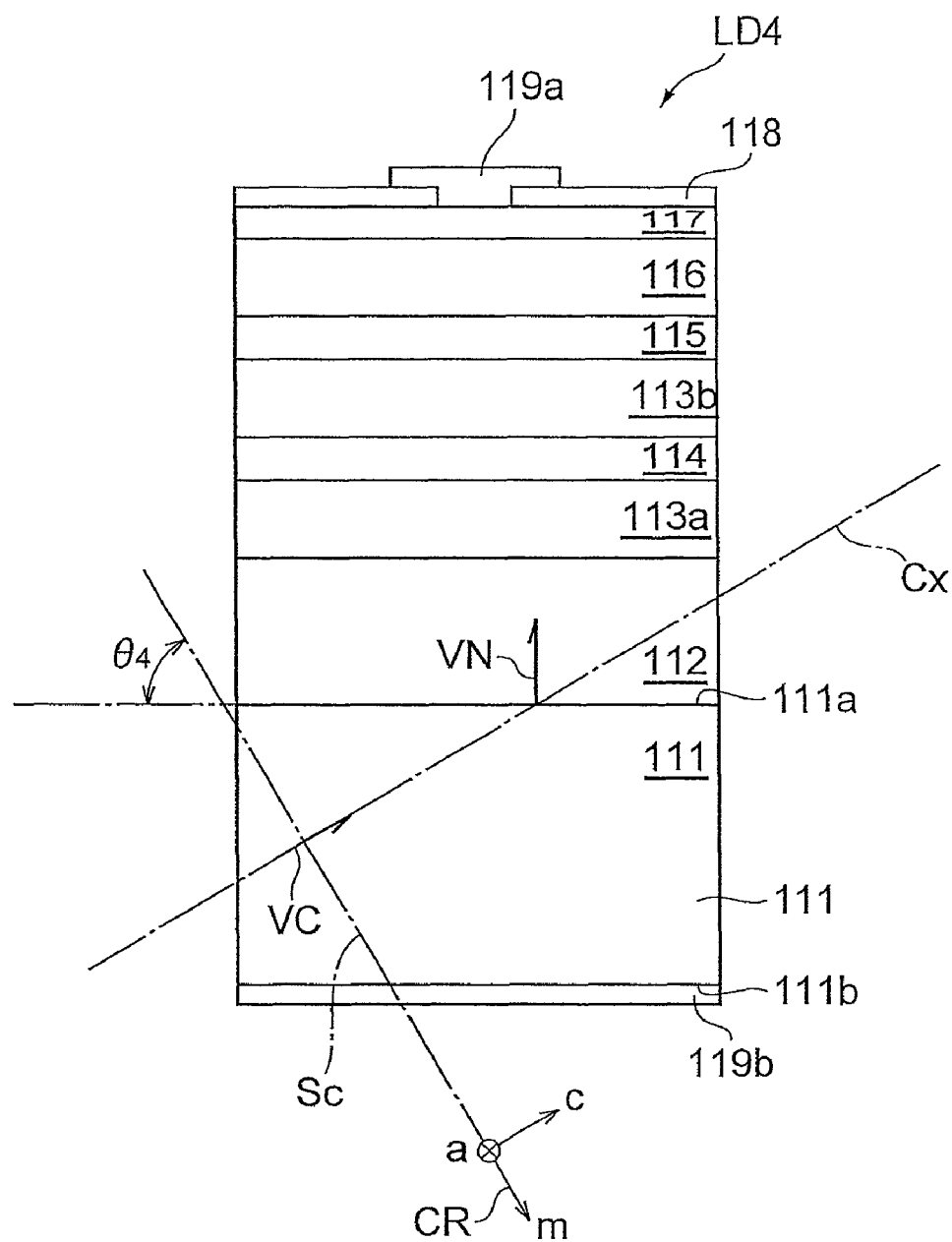
FIG. 15 is a view illustrating a structure of a laser diode of Example 5.

A laser diode LD4 was fabricated. FIG. 15 illustrates the structure of the laser diode of Example 5. A GaN substrate 111 was prepared, and the substrate 111 has a semipolar primary surface tilting toward an m-axis by an angle $\theta_4$ of 68 degrees. The GaN substrate 111 was loaded to a growth reactor, and ammonia ($NH_3$) and hydrogen ($H_2$) were supplied to the reactor, and the GaN substrate 111 was subjected to the atmosphere at a temperature of 1050° C. After the pretreatment, a source gas was supplied to the reactor to fabricate a laser structure as follows. First, an n-type $Al_{0.04}Ga_{0.96}N$ cladding layer 112 was grown at a temperature of 1050° C. The substrate temperature was decreased to 840° C. to grow an $In_{0.03}Ga_{0.97}N$ optical guide layer 113a. On the $In_{0.03}Ga_{0.97}N$ optical guide layer 113a, an active layer 114 was grown. At a substrate temperature of 840° C., an $In_{0.03}Ga_{0.97}N$ optical guide layer 113b was deposited on the active layer 114. The substrate temperature was increased to 1000° C., and then an $Al_{0.12}Ga_{0.88}N$ electron block layer 115, a p-type $Al_{0.06}Ga_{0.94}N$ cladding layer 116, and a p-type GaN contact layer 117 were grown thereon. The resulting laser structure had a photoluminescence wavelength of 450 nm.

A refinery was installed between the stock of nitrogen source and the growth reactor in order to adjust the water concentration in a nitrogen source such as ammonia. The refinery was used to supply the ammonia as a refined nitrogen source to the growth reactor. By use of the refinery, ammonia having water content of 500 ppb % or less as a nitrogen source can be prepared to the growth reactor. By use of the refinery, ammonia having water content of 50 ppb % or less as a nitrogen source can be used. By use of the refinery, ammonia having water content of 1 ppb % or less as a nitrogen source can be supplied to the growth reactor. In Example 5, ammonia having water content of 50 ppb % or less was supplied to the growth reactor as a nitrogen source.

The oxygen concentration measurement of the laser structure shows that the p-type $Al_{0.06}Ga_{0.94}N$ cladding layer had an oxygen concentration of $2\times10^{17}$ cm$^{-3}$. Ammonia having water content of 1 ppm % or less was also used as a nitrogen source for comparison. The oxygen concentration measurement of the laser structure shows that the p-type AlGaN layer had an oxygen concentration of $8\times10^{18}$ cm$^{-3}$.

After an $SiO_2$ film was formed on the p-type GaN contact layer 117 of the LD structure of Example 5, the $SiO_2$ film is wet etched for forming a stripe-shaped window of 10 μm in width to form a protection film 118. A p-electrode 119a of Ni/Au and a pad electrode of Ti/Au were formed by evaporation. An n-electrode 119b of Ti/Al and a pad electrode of Ti/Au were formed on the back surface 111b of the substrate by evaporation. Similarly, an $SiO_2$ film and electrodes were formed on the LD structure of Comparative Example. Gain-guided laser structures were fabricated with a-plane cleavage at an interval of 800 μm.

Figure 16:
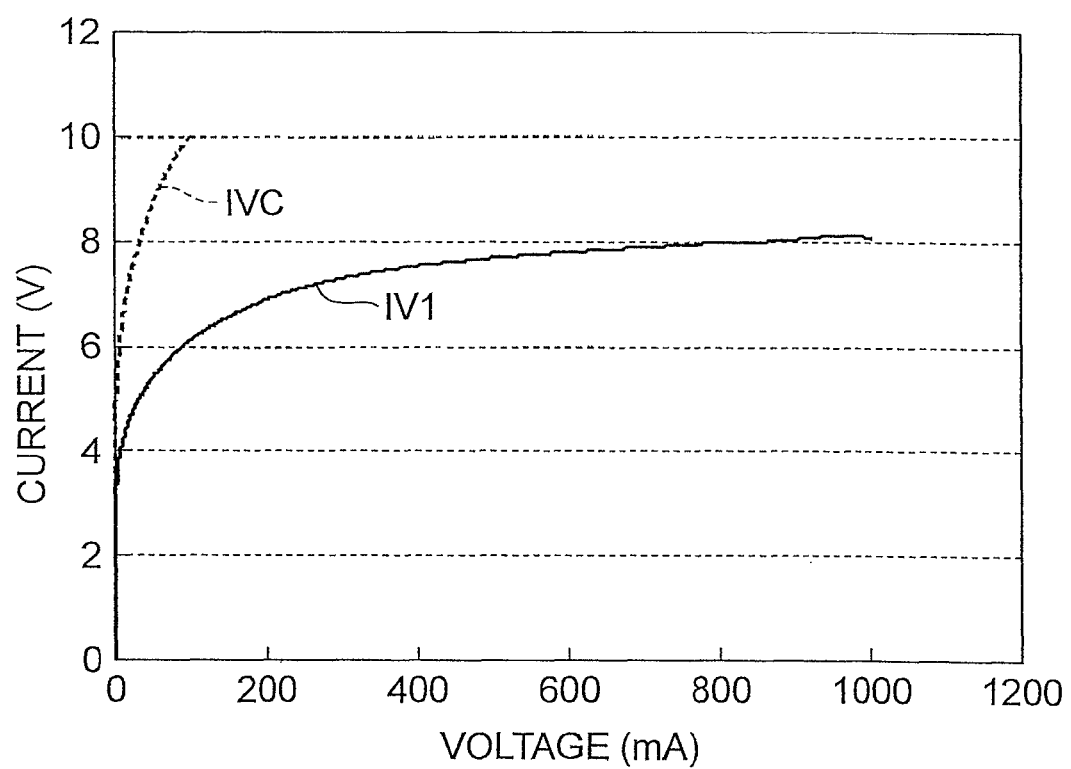
FIG. 16 is a graph illustrating I-V characteristics of laser diodes of Example 5 and Comparative Example.

FIG. 16 is a graph illustrating I-V characteristics of the laser diodes of Example 5 and Comparative Example: the characteristics curves IV1 and IVC represent the I-V characteristics of Example 5 and Comparative Example, respectively. The driving voltage for the laser diode of Comparative Example is significantly higher than that for the laser diode of Example 5. This is probably because, in the laser diode of Comparative Example, the p-type contact layers had so high oxygen concentrations due to low purity of ammonia that its p-type conductivity was impaired.

As described above, the present embodiment provides a group III nitride optical semiconductor device having a gallium nitride semiconductor film with satisfactory surface morphology. The present embodiment also provides a method of fabricating the group III nitride optical semiconductor device. Furthermore, the present embodiment provides an epitaxial substrate having a gallium nitride semiconductor film with satisfactory surface morphology.

In the foregoing, the detail description of the present embodiment was made with reference to optical semiconductor devices, but the present invention can be applied to a group III nitride semiconductor electron devices, which is one of examples of semiconductor devices. Thus, a group III nitride semiconductor electron device having a gallium nitride semiconductor film with satisfactory surface morphology can be provided. The present embodiment also provides a method of fabricating the group III nitride semiconductor electron device. Furthermore, the present embodiment provides an epitaxial substrate having a gallium nitride semiconductor film with satisfactory surface morphology.

Having described and illustrated the principle of the invention in a preferred embodiment thereof, it is appreciated by those having skill in the art that the invention can be modified in arrangement and detail without departing from such principles. The present invention is not limited to certain structures disclosed in the above embodiments. The above embodiments refer to the deposition of a nitride semiconductor, but the present invention can be applied to the deposition of a nitride semiconductor using molecular beam epitaxy with oxygen doping. We therefore claim all modifications and variations coming within the spirit and scope of the following claims.

| Reference Sings List | |
|---|---|
| 11a, 11b | group III nitride optical semiconductor device |
| 13 | group III nitride semiconductor supporting base |
| 15 | gallium nitride based semiconductor region |
| 17 | active layer |
| 19 | gallium nitride based semiconductor region |
| Sc | reference plane |
| VC | c-axis vector |
| VN | normal vector |
| $A_{off}$ | tilt angle |
| 21 | first conductive type gallium nitride based semiconductor layer |
| 23 | gallium nitride based semiconductor layer |
| 25 | gallium nitride based semiconductor layer |
| 27 | second conductive type gallium nitride based semiconductor layer |
| 29a | well layer |
| 29b | barrier layer |
| 29 | quantum well structure |
| 31a, 31b | junction |
| 33 | first electrode |
| 35 | second electrode |

The invention claimed is:

1. A group III nitride semiconductor device, comprising:
    a group III nitride semiconductor supporting base, the group III nitride semiconductor supporting base being composed of a group III nitride semiconductor, the group III nitride semiconductor supporting base having a primary surface, the primary surface being tilted at a finite angle with reference to a reference plane, the reference plane being orthogonal to a reference axis, and the reference axis extending in a direction of a c-axis of the group III nitride semiconductor; and
    a gallium nitride based semiconductor region provided on the primary surface of the group III nitride semiconductor supporting base, the gallium nitride based semiconductor region having an oxygen concentration of from $5\times10^{16}$ cm$^{-3}$ to $5\times10^{18}$ cm$^{-3}$, the primary surface having one of semi-polarity and non-polarity, and the gallium nitride based semiconductor region including a first conductive type gallium nitride based semiconductor layer.

2. The group III nitride semiconductor device according to claim 1, further comprising:
    an active layer provided on the gallium nitride based semiconductor region; and
    a second conductive type gallium nitride based semiconductor layer provided on the active layer, the active layer being provided between the first conductive type gallium nitride based semiconductor layer and the second conductive type gallium nitride based semiconductor layer.

3. The group III nitride semiconductor device according to claim 2, wherein the active layer has an oxygen concentration of $5\times10^{16}$ cm$^{-3}$ or more, and the active layer has an oxygen concentration of $5\times10^{18}$ cm$^{-3}$ or less.

4. The group III nitride semiconductor device according to claim 2, wherein the second conductive type gallium nitride based semiconductor layer has an oxygen concentration of $5\times10^{16}$ cm$^{-3}$ or more, and the second conductive type gallium nitride based semiconductor layer has an oxygen concentration of $5\times10^{18}$ cm$^{-3}$ or less.

5. The group III nitride semiconductor device according to claim 2, wherein
    the first conductive type gallium nitride based semiconductor layer has a carbon concentration of $5\times10^{18}$ cm$^{-3}$ or less, the second conductive type gallium nitride based semiconductor layer has a carbon concentration of $5\times10^{18}$ cm$^{-3}$ or less, and
the active layer has a carbon concentration of $5\times10^{18}$ cm$^{-3}$ or less.

6. The group III nitride semiconductor device according to claim 2, wherein
the second conductive type gallium nitride based semiconductor layer has an oxygen concentration of $5\times10^{16}$ cm$^{-3}$ or more, and
the active layer has an oxygen concentration of $5\times10^{16}$ cm$^{-3}$ or more.

7. The group III nitride semiconductor device according to claim 2, wherein
the active layer includes well layers and barrier layers alternatively arranged, and
the well layers have an oxygen concentration of $6\times10^{17}$ cm$^{-3}$ or less.

8. The group III nitride semiconductor device according to claim 2, further comprising another second conductive type gallium nitride based semiconductor layer,
wherein the second conductive type gallium nitride based semiconductor layer has a band gap larger than that of the other second conductive type gallium nitride based semiconductor layer,
the second conductive type gallium nitride based semiconductor layer has an oxygen concentration higher than that of the active layer,
the second conductive type gallium nitride based semiconductor layer is provided between the other second conductive type gallium nitride based semiconductor layer and the active layer, and
the second conductive type gallium nitride based semiconductor layer forms a junction with the other second conductive type gallium nitride based semiconductor layer.

9. The group III nitride semiconductor device according to claim 2, further comprising an optical guide layer, the optical guide layer being composed of gallium nitride based semiconductor and being provided between the active layer and the second conductive type gallium nitride based semiconductor layer,
wherein the active layer extends along a plane inclined at an angle with reference to the reference plane, and the second conductive type gallium nitride based semiconductor layer is an electron block layer.

10. The group III nitride semiconductor device according to claim 2, wherein the primary surface has a normal line extending at an angle in a range of 10 to 170 degrees with reference to the reference axis.

11. The group III nitride semiconductor device according to claim 2, wherein the primary surface has a normal line extending at an angle within a range of from 10 to 80 degrees and from 100 to 170 degrees with reference to the reference axis.

12. The group III nitride semiconductor device according to claim 2, wherein
the primary surface has a normal line extending at an angle within a range of from 63 to 80 degrees and from 100 to 117 degrees with reference to the reference axis.

13. An epitaxial wafer for a group III nitride semiconductor device, comprising:
a group III nitride semiconductor substrate having a primary surface, the group III nitride semiconductor substrate being composed of a group III nitride semiconductor, and the primary surface being tilted at a finite angle with reference to a reference plane, the reference plane being orthogonal to a reference axis, and the reference axis extending in a direction of a c-axis of the group III nitride semiconductor;
a first conductive type gallium nitride based semiconductor layer having an oxygen concentration of from $5\times10^{16}$ cm$^{-3}$ to $5\times10^{18}$ cm$^{-3}$ or less, the first conductive type gallium nitride based semiconductor layer being provided on the primary surface of the group III nitride semiconductor substrate;
a light emitting layer provided on the first conductive type gallium nitride based semiconductor layer; and
a second conductive type gallium nitride based semiconductor layer provided on the light emitting layer;
the primary surface having one of semi-polarity and non-polarity.

14. The epitaxial wafer according to claim 13, further comprising another second conductive type gallium nitride based semiconductor layer,
wherein the second conductive type gallium nitride based semiconductor layer has a band gap larger than that of the other second conductive type gallium nitride based semiconductor layer,
the second conductive type gallium nitride based semiconductor layer has an oxygen concentration higher than that of the light emitting layer,
the second conductive type gallium nitride based semiconductor layer is provided between the other second conductive type gallium nitride based semiconductor layer and the light emitting layer, and
the second conductive type gallium nitride based semiconductor layer forms a junction with the other second conductive type gallium nitride based semiconductor layer.

15. The epitaxial wafer according to claim 13, wherein
the second conductive type gallium nitride based semiconductor layer has an oxygen concentration of $5\times10^{16}$ cm$^{-3}$ or more,
the second conductive type gallium nitride based semiconductor layer has an oxygen concentration of $5\times10^{18}$ cm$^{-3}$ or less,
the second conductive type gallium nitride based semiconductor layer is an electron block layer,
the light emitting layer includes an active layer having well layers and barrier layers alternatively arranged,
the light emitting layer further includes an optical guide layer composed of gallium nitride based semiconductor, and the optical guide layer is provided between the active layer and the second conductive type gallium nitride based semiconductor layer, and
the optical guide layer of the light emitting layer extends along a plane inclined with reference to the reference plane.

16. The epitaxial wafer according to claim 13, wherein the primary surface has a normal line tilted at an angle of from 10 to 170 degrees with reference to the reference axis.

17. The epitaxial wafer according to claim 13, wherein the primary surface has a normal line tilted at an angle within a range of from 10 to 80 degrees and from 100 to 170 degrees with reference to the reference axis.

18. The epitaxial wafer according to claim 13, wherein the primary surface has a normal line tilted at an angle within a range of from 63 to 80 degrees and from 100 to 117 degrees with reference to the reference axis.

19. A method of fabricating a group III nitride semiconductor device, comprising the steps of:

preparing a group III nitride semiconductor substrate made of a group III nitride semiconductor and having a primary surface;

supplying a group III source and a nitrogen source to a growth reactor to grow a first conductive type gallium nitride based semiconductor layer on the primary surface of the group III nitride semiconductor substrate, the first conductive type gallium nitride based semiconductor layer having an oxygen concentration of from $5\times10^{16}$ cm$^{-3}$ to $5\times10^{18}$ cm$^{-3}$;

supplying a group III source and a nitrogen source to the growth reactor to grow a light emitting layer on the first conductive type gallium nitride based semiconductor layer; and supplying a group III source and a nitrogen source to the growth reactor to grow a second conductive type gallium nitride based semiconductor layer on the light emitting layer, the primary surface having one of semi-polarity and non-polarity, oxygen in the first conductive type gallium nitride based semiconductor layer being provided as an impurity contained in at least one of the group III source and the nitrogen source, and the primary surface of the group III nitride semiconductor substrate forming a finite angle with a reference plane, the reference plane being orthogonal to a reference axis, and the reference axis extending in a direction of a c-axis of the group III nitride semiconductor.

20. The method according to claim 19, wherein
the nitrogen source comprises ammonia,
the nitrogen source comprises water as an impurity,
the light emitting layer has an average oxygen concentration of $5\times10^{16}$ cm$^{-3}$ or more, and the light emitting layer has an average oxygen concentration of $5\times10^{18}$ cm$^{-3}$ or less,
the second conductive type gallium nitride based semiconductor layer has an oxygen concentration of $5\times10^{16}$ cm$^{-3}$ or more, and the second conductive type gallium nitride based semiconductor layer has an oxygen concentration of $5\times10^{18}$ cm$^{-3}$ or less, and
the second conductive type gallium nitride based semiconductor layer has an oxygen concentration higher than the oxygen concentration in the light emitting layer.

21. The method according to claim 19, wherein the second conductive type gallium nitride based semiconductor layer is grown at a temperature lower than a growth temperature for the first conductive type gallium nitride based semiconductor layer.

22. The method according to claim 19, wherein the light emitting layer comprises an InGaN layer.

23. The method according to claim 19, wherein the primary surface has a normal line extending at an angle of from 10 to 170 degrees with reference to the reference axis.

24. The method according to claim 19, wherein the primary surface has a normal line extending at an angle within a range of from 63 to 80 degrees and from 100 to 117 degrees relative to a reference axis.

25. The method according to claim 19, wherein the nitrogen source is supplied to a growth reactor after a water concentration in the nitrogen source is adjusted using a refinery provided between a stock of the nitrogen source and the growth reactor, and the nitrogen source comprises ammonia.

26. The method according to claim 19, wherein ammonia containing water at 500 ppb % or less is used as the nitrogen source.

27. The method according to claim 19, wherein ammonia containing water at 50 ppb % or less is used as the nitrogen source.

28. The method according to claim 19, wherein ammonia containing water at 1 ppb % or less is used as the nitrogen source.

29. The method according to claim 25, wherein the nitrogen source contains water at 1 ppb % or less.

* * * * *